(12) United States Patent  
Sundström et al.

(10) Patent No.: US 8,624,660 B2
(45) Date of Patent: Jan. 7, 2014

(54) METHOD AND APPARATUS FOR MIXER-BASED HARMONIC REJECTION

(75) Inventors: Lars Sundström, Södra Sandby (SE); Martin Anderson, Lund (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 13/450,537

(22) Filed: Apr. 19, 2012

(65) Prior Publication Data

US 2013/0278321 A1    Oct. 24, 2013

(51) Int. Cl.
*G01V 3/02*    (2006.01)
(52) U.S. Cl.
USPC .......................... 327/356; 327/355; 455/323
(58) Field of Classification Search
USPC .................. 327/355–361; 455/323, 326
See application file for complete search history.

(56) References Cited

U.S. PATENT DOCUMENTS

| 8,140,044 | B2 * | 3/2012 | Villain et al. ................. 455/313 |
| 8,351,891 | B2 * | 1/2013 | Heydari et al. ............... 455/333 |
| 8,362,820 | B2 * | 1/2013 | Deguchi et al. .............. 327/355 |
| 2010/0233987 | A1 | 9/2010 | Rafi et al. |
| 2010/0253412 | A1 | 10/2010 | Brekelmans et al. |
| 2011/0298521 | A1 | 12/2011 | Ru et al. |
| 2012/0046007 | A1 | 2/2012 | Rafi |

FOREIGN PATENT DOCUMENTS

| EP | 2136468 A1 | 12/2009 |
| EP | 2246975 A1 | 11/2010 |
| EP | 2333949 A1 | 6/2011 |
| EP | 2360835 A1 | 8/2011 |

\* cited by examiner

*Primary Examiner* — Dinh T. Le
(74) *Attorney, Agent, or Firm* — Murphy, Bilak & Homiller, PLLC

(57) ABSTRACT

In one aspect, the present invention exploits the termination conductances of a time-discrete harmonic mixer as another degree of freedom in configuring the mixer to meet given harmonic rejection performance requirements while using reduced number of unit cells. The values of these termination conductances are purposefully configured to introduce a desired non-linearity in quantization of the mixer transconductance by the unit cells. The non-uniform quantization produces a non-linear fitting of the transconductance levels to the transconductance points defining the target sinusoidal waveform. As a consequence of its termination conductance configuration, the contemplated mixer achieves levels of harmonic rejection with that would not be met if the reduced number of unit cells operated with uniform quantization. As a further advantage, the manipulated conductance values generally are lower than those used in conventional designs, e.g., on par with the maximum conductance of the mixer, as provided by mixer's set of unit cells.

8 Claims, 24 Drawing Sheets

| N | THD [dB] | GS | GL | Phase [°] |
|---|---|---|---|---|
| 4 | -94.6 | 1.15 | 1.15 | 12 |
| 5 | -23.5 | 20 | 20 | 23.6 |
| 6 | -31.0 | 20 | 20 | 0 |
| 7 | -92.9 | 3.95 | 3.95 | 16.2 |
| 8 | -94.6 | 1.15 | 1.15 | 18 |
| 9 | -29.4 | 1.05 | 1.05 | 21.2 |
| 10 | -42.0 | 1.05 | 1.05 | 40.6 |
| 11 | -65.3 | 2 | 2 | 19.4 |
| 12 | -94.6 | 1.15 | 1.15 | 20 |
| 13 | -38.7 | 20 | 20 | 9 |
| 14 | -92.4 | 6 | 6 | 0 |
| 15 | -63.5 | 1.7 | 1.7 | 21.6 |
| 16 | -94.6 | 1.15 | 1.15 | 21.2 |
| 17 | -42.6 | 1.6 | 1.6 | 22.4 |
| 18 | -58.8 | 1.25 | 1.25 | 42.6 |
| 19 | -73.2 | 2.15 | 2.15 | 11 |
| 20 | -71.3 | 2.1 | 2.1 | 20.8 |

| N | THD [dB] | GS | GL | Phase [°] |
|---|---|---|---|---|
| 4 | -21.3 | 20 | 20 | 23.6 |
| 5 | -21.1 | 4.5 | 4.5 | 0 |
| 6 | -71.3 | 1.85 | 1.85 | 0 |
| 7 | -26.4 | 1.05 | 1.05 | 36.2 |
| 8 | -31.0 | 1.05 | 1.05 | 32.2 |
| 9 | -30.6 | 5.75 | 5.75 | 12.6 |
| 10 | -37.7 | 20 | 20 | 30.4 |
| 11 | -30.1 | 20 | 20 | 14.8 |
| 12 | -71.3 | 1.85 | 1.85 | 0 |
| 13 | -37.0 | 1.2 | 1.2 | 14.6 |
| 14 | -59.7 | 1.05 | 1.05 | 33.2 |
| 15 | -34.5 | 3.1 | 3.1 | 7.4 |
| 16 | -91.4 | 6.4 | 6.4 | 33.8 |
| 17 | -36.7 | 1.05 | 1.05 | 16.2 |
| 18 | -71.3 | 1.85 | 1.85 | 0 |
| 19 | -39.6 | 1.45 | 1.45 | 21.4 |
| 20 | -83.0 | 1.2 | 1.2 | 0 |

| N | THD [dB] | GS | GL | Phase [°] |
|---|---|---|---|---|
| 4 | -23.6 | 20 | 20 | 0 |
| 5 | -20.9 | 1.3 | 1.3 | 0 |
| 6 | -24.4 | 1.05 | 1.05 | 0 |
| 7 | -23.3 | 4.8 | 4.8 | 34.2 |
| 8 | -35.1 | 20 | 20 | 8.8 |
| 9 | -37.6 | 1.4 | 1.4 | 40.8 |
| 10 | -28.7 | 1.05 | 1.05 | 43.8 |
| 11 | -28.9 | 1.55 | 1.55 | 12.4 |
| 12 | -35.0 | 20 | 20 | 25.4 |
| 13 | -31.9 | 2 | 2 | 38 |
| 14 | -35.1 | 20 | 20 | 12.4 |
| 15 | -33.3 | 1.15 | 1.15 | 6.2 |
| 16 | -46.4 | 20 | 20 | 0 |
| 17 | -72.4 | 2.2 | 2.2 | 12.4 |
| 18 | -49.7 | 1.7 | 1.7 | 27.4 |
| 19 | -34.0 | 1.25 | 1.25 | 0 |
| 20 | -41.1 | 1.05 | 1.05 | 28 |

| N | THD [dB] | GS | GL | Phase [°] |
|---|---|---|---|---|
| 4 | -21.3 | 20 | 20 | 23.6 |
| 5 | -21.1 | 5 | 5 | 23.2 |
| 6 | -48.7 | 2 | 2 | 0 |
| 7 | -26.5 | 1 | 1 | 28.4 |
| 8 | -32.2 | 1 | 1 | 32 |
| 9 | -30.6 | 6 | 6 | 12.6 |
| 10 | -37.7 | 20 | 20 | 30.4 |
| 11 | -30.1 | 20 | 20 | 14.8 |
| 12 | -48.7 | 2 | 2 | 0 |
| 13 | -33.8 | 1 | 1 | 14.6 |
| 14 | -51.2 | 1 | 1 | 33 |
| 15 | -34.5 | 3 | 3 | 7.2 |
| 16 | -64.5 | 6 | 6 | 0 |
| 17 | -39.1 | 1 | 1 | 16 |
| 18 | -48.7 | 2 | 2 | 0 |
| 19 | -36.6 | 20 | 20 | 6.2 |
| 20 | -41.7 | 20 | 20 | 15.6 |

| N | THD [dB] | GS | GL | Phase [°] |
|---|---|---|---|---|
| 4 | -23.6 | 20 | 20 | 0 |
| 5 | -20.7 | 1 | 1 | 0 |
| 6 | -24.5 | 1 | 1 | 0 |
| 7 | -23.3 | 5 | 5 | 34.2 |
| 8 | -35.1 | 20 | 20 | 8.8 |
| 9 | -32.8 | 2 | 2 | 41.6 |
| 10 | -29.1 | 1 | 1 | 43.6 |
| 11 | -28.7 | 1 | 1 | 16.6 |
| 12 | -35.3 | 1 | 1 | 11.4 |
| 13 | -31.9 | 2 | 2 | 38 |
| 14 | -35.1 | 20 | 20 | 12.4 |
| 15 | -32.6 | 1 | 1 | 5.8 |
| 16 | -46.4 | 20 | 20 | 0 |
| 17 | -48.0 | 2 | 2 | 12.2 |
| 18 | -41.9 | 2 | 2 | 27.4 |
| 19 | -33.3 | 3 | 3 | 0.2 |
| 20 | -40.4 | 1 | 1 | 0 |

| N | THD [dB] | GS | GL | Phase [°] |
|---|---|---|---|---|
| 4 | -35.7 | 1 | 2 | 12.6 |
| 5 | -23.5 | 20 | 20 | 23.6 |
| 6 | -31.0 | 20 | 20 | 0 |
| 7 | -73.6 | 4 | 4 | 16.2 |
| 8 | -61.8 | 1 | 3 | 0 |
| 9 | -29.0 | 1 | 4 | 24.2 |
| 10 | -38.4 | 20 | 20 | 19.2 |
| 11 | -65.3 | 2 | 2 | 19.4 |
| 12 | -41.3 | 1 | 3 | 32.4 |
| 13 | -38.7 | 20 | 20 | 9 |
| 14 | -92.4 | 6 | 6 | 0 |
| 15 | -47.1 | 1 | 3 | 21.8 |
| 16 | -65.8 | 1 | 8 | 21.4 |
| 17 | -38.7 | 20 | 20 | 0.2 |
| 18 | -40.9 | 1 | 2 | 42.4 |
| 19 | -69.0 | 1 | 4 | 11 |
| 20 | -63.1 | 1 | 4 | 20.6 |

| N | THD [dB] | GS | GL | Phase [°] |
|---|---|---|---|---|
| 4 | -21.3 | 20 | 20 | 23.6 |
| 5 | -21.1 | 1 | 14 | 23 |
| 6 | -71.5 | 1 | 3 | 27.6 |
| 7 | -25.6 | 20 | 20 | 23 |
| 8 | -26.4 | 1 | 2 | 0 |
| 9 | -30.6 | 2 | 14 | 12.6 |
| 10 | -37.7 | 20 | 20 | 30.4 |
| 11 | -30.1 | 20 | 20 | 14.8 |
| 12 | -71.5 | 1 | 3 | 32.4 |
| 13 | -35.1 | 1 | 2 | 15.2 |
| 14 | -33.1 | 1 | 2 | 0 |
| 15 | -34.5 | 1 | 8 | 22.6 |
| 16 | -104.9 | 4 | 10 | 33.8 |
| 17 | -34.4 | 20 | 20 | 9 |
| 18 | -71.5 | 1 | 3 | 34.2 |
| 19 | -39.6 | 1 | 2 | 21.4 |
| 20 | -41.7 | 20 | 20 | 15.6 |

| N | THD [dB] | GS | GL | Phase [°] |
|---|---|---|---|---|
| 4 | -23.6 | 20 | 20 | 0 |
| 5 | -20.9 | 1 | 2 | 0 |
| 6 | -23.6 | 20 | 20 | 9.6 |
| 7 | -23.3 | 1 | 16 | 16.2 |
| 8 | -35.1 | 20 | 20 | 8.8 |
| 9 | -37.4 | 1 | 2 | 11 |
| 10 | -27.6 | 20 | 20 | 5.8 |
| 11 | -28.9 | 1 | 2 | 12 |
| 12 | -35.0 | 20 | 20 | 25.4 |
| 13 | -31.9 | 2 | 2 | 38 |
| 14 | -35.1 | 20 | 20 | 12.4 |
| 15 | -31.4 | 1 | 2 | 37 |
| 16 | -46.4 | 20 | 20 | 0 |
| 17 | -61.1 | 1 | 4 | 12.4 |
| 18 | -46.2 | 1 | 3 | 27.4 |
| 19 | -33.4 | 1 | 2 | 15.6 |
| 20 | -39.1 | 20 | 20 | 21.4 |

| N  | THD [dB] | GS | GL | Phase [°] |
|----|----------|----|----|-----------|
| 4  | -38.7    | 1  | 1  | 11.4      |
| 5  | -24.1    | 1  | 1  | 18        |
| 6  | -29.1    | 5  | 5  | 0         |
| 7  | -79.4| 4| 4| 15.6|
| 8  | -60.3| 3| 1| 0   |
| 9  | -30.7    | 1  | 1  | 19.6      |
| 10 | -47.1    | 1  | 1  | 40.8      |
| 11 | -61.1| 2| 2| 18.4|
| 12 | -41.5    | 1  | 3  | 4.2       |
| 13 | -36.0    | 5  | 5  | 8.6       |
| 14 | -79.4| 4| 4| 19.2|
| 15 | -48.4    | 1  | 3  | 19.8      |
| 16 | -60.3| 3| 1| 0   |
| 17 | -40.1    | 5  | 5  | 19.4      |
| 18 | -81.0| 5| 1| 20  |
| 19 | -71.1| 4| 1| 10.8|
| 20 | -47.1    | 1  | 1  | 43        |

| N | THD [dB] | GS | GL | Phase [°] |
|---|---|---|---|---|
| 4 | -37.9 | 1 | 2 | 12.4 |
| 5 | -24.3 | 1 | 1 | 18 |
| 6 | -28.8 | 5 | 5 | 0 |
| 7 | -75.0 | 4 | 5 | 15.6 |
| 8 | -99.1 | 1 | 4 | 0 |
| 9 | -31.2 | 1 | 1 | 19.6 |
| 10 | -54.3 | 1 | 1 | 40.8 |
| 11 | -55.0 | 4 | 1 | 18.4 |
| 12 | -41.8 | 1 | 3 | 4.2 |
| 13 | -36.5 | 1 | 1 | 20.2 |
| 14 | -75.0 | 4 | 5 | 19.2 |
| 15 | -77.8 | 1 | 3 | 19.8 |
| 16 | -99.1 | 1 | 4 | 0 |
| 17 | -41.7 | 1 | 1 | 20.6 |
| 18 | -61.3 | 5 | 1 | 20 |
| 19 | -62.1 | 4 | 1 | 10.8 |
| 20 | -54.3 | 1 | 1 | 43 |

METHOD AND APPARATUS FOR MIXER-BASED HARMONIC REJECTION

TECHNICAL FIELD

The present invention generally relates to mixer circuits, such as used in communication signal processing, and particularly relates to time-discrete harmonic rejection mixers.

BACKGROUND

FIG. 1 roughly outlines the principle of a time-continuous passive harmonic rejection (HR) mixer. A voltage source, $v_S$, drives a variable resistor network to generate an output current equal to $$i_L = g_m \cdot \frac{v_s}{2} = \alpha G_m \cdot \frac{v_s}{2} \quad (1)$$

where $G_m$ may be regarded as a maximum gain or conductance value, and where the term $\alpha = \cos(2\pi f_{LO} t)$ provides the harmonic rejection by avoiding conversion at multiples of $f_{LO}$. The $\alpha$ term may be regarded as a sinusoidal scaling factor operating on $G_m$.

Assuming the mixer illustrated in FIG. 1 has ideal termination—i.e., zero ohm termination at its input and output ports—the mixer will exhibit a sinusoidally varying transconductance given as $g_m = \alpha G_m$. The cross-coupled structure of the mixer ensures that the input and output conductance of the mixer remains constant with respect to $\alpha$ because $G_1 + G_2 = G_m$.

In practice, the mixer terminations will not be ideal, i.e., they will not be zero ohms. (Here, it should be remembered that zero ohms equates to infinite conductance.) FIG. 2 illustrates the real-world presence of non-ideal mixer terminations, where $G_S$ denotes the non-ideal source termination conductance at the mixer input port, and $G_L$ denotes the non-ideal load termination conductance at the mixer output port.

In the non-ideal termination case, the transfer function of the mixer becomes a function of the source and load termination conductances and is given as $$i_L = g_m v_s = v_s \left( \frac{\alpha G_m / 2}{1 + \frac{G_m^2}{G_S G_L} + \frac{G_m(G_S + G_L)}{G_S G_L} - \frac{\alpha^2 G_m^2}{G_S G_L}} \right) \quad (2)$$

However, while ideal terminations are not possible in practice, the design convention is to make the termination conductance values such that the transfer function substantially minors the ideal termination case. That is, if the load and source conductances satisfy $$G_S G_L \gg G_m^2 \quad (3)$$

then the mixer's actual transfer function will approximate Eq. (1), corresponding to the ideal case. Thus, while infinite conductance values cannot be achieved in practice, conventional mixer design dictates the use of termination conductances that essentially remove the influence of those terminations on mixer operation.

Such practice is understandable because Eq. (2) demonstrates that the lower the termination conductance the less ideal the mixer behavior. This fact is exemplified in FIG. 3, where the ratio of third harmonic (H3) from Eq. (2) to the fundamental harmonic (H1) with $\alpha = \cos(2\pi f_{LO} t)$ is shown as a function of relative termination conductances. Here, "relative" connotes the size relationship between $G_S$ or $G_L$ and $G_m$. In particular, FIG. 3 represents a contour plot of the third harmonic relative to the fundamental frequency as a function of the mixer's source and load termination conductances.

A harmonic rejection mixer with time-continuous operation according to the description above is not feasibly implemented. A more practical realization operates on a discrete-time basis and uses a so-called mixer "unit cell," such as is shown in FIG. 4. The unit cell contains a pair of resistors having a resistance $R_u = 1/G_u$.

The unit cell also includes a "sign-switching" network controlled by control signals S and Sbar, where Sbar is the logical inverse of S. One sees that the sign-switching network comprises pairs of cross-coupled switches that take on a specific open/closed pattern responsive to the values of S and Sbar. Thus, the S/Sbar signals applied to the unit cell discretely control its conductance.

In making a complete time-discrete harmonic rejection mixer, a vector of N unit cells are connected in parallel as shown in FIG. 5—where the cells are identified as "MUCs" for mixer unit cells. The switches are controlled to generate a time-discrete sinusoidal transconductance. Thus, the effective Local Oscillator (LO) waveform is represented by a thermometer code S<1:N>, S(k)={0, 1}, such that the differential transconductance of the mixer becomes (assuming ideal termination)

$$g_m = G_u \sum_{k=1}^{N} (S(k) - Sbar(k)) \quad (4)$$

A digital sequencer provides the S/Sbar control signals for the vector of unit cells. The sequencer may be, for example, a memory that is cyclically accessed to obtain the unit cell sign pattern sequence. The digital sequencer thus generates the sequence of control words (S/Sbar sign patterns) corresponding to the series of time-discrete sinusoidal transconductance values desired for the mixer.

Assuming mixer terminations that are ideal or sufficiently close to ideal, the discretization of the mixer into N unit cells means that the mixer transconductance will be uniformly quantized into N+1 levels given by $$g_m \in [-NG_u - (N-2)G_u \ldots (N-2)G_u N G_u]. \quad (5)$$

Thus, $\alpha = \cos(2\pi f_{LO} t)$ will be quantized too, leading to more or less quantization error in dependence on the number of waveform samples used to represent one LO period and in strong dependence on the number of unit cells available in the mixer.

This latter dependence arises from the fact that the quantization function provided by the unit cells has a quantization resolution that improves directly with an increasing number of unit cells. Thus, the ability to adjust the transconductance value of the mixer to obtain the discrete transconductance points corresponding to the desired sinusoidal waveform requires a certain quantization resolution. Put simply, the number of unit cells in the mixer dictates the transconductance quantization resolution.

The downside of high unit cell counts includes, among other things, higher costs, higher power consumption, and larger circuit sizes. Somewhat mitigating these issues, there are known techniques for reducing quantization errors when using given numbers of unit cells. In particular, it is known to use an integer number of samples per LO period and, correspondingly, to use the number of unit cells that leads to the highest spectral purity—i.e., minimized harmonic content and therefore maximized harmonic rejection. More broadly, there are known techniques for finding optimal combinations of unit cell counts and phase offsets for the LO sinusoid, for specified numbers of samples per LO period.

Such approaches demonstrate that is possible to find a relatively low number of quantization levels required to accurately represent a sinusoid with a given number of samples per period, but the number of required quantization levels can still be quite high in practice. The required number is particularly high for cases with a large number of samples per LO period. As noted, increasing the unit cell count dramatically affects mixer size and the complexity of unit cell control signal distribution, so the known optimization approaches do not provide an effective path to minimizing unit cell counts.

Also, note that even with sufficient quantization resolution, high harmonic rejection, say >60 dB, requires rather high relative conductance termination. This point is made in FIG. 3. A poor termination at one mixer port needs to be compensated for by a corresponding increase in termination conductance at the other port. Furthermore, the termination conductance must be maintained over the entire range of LO harmonics for which high harmonic rejection is required. In this regard, high termination conductance becomes increasingly difficult to realize as the frequency range increases, and harmonic rejection performance is therefore prone to degrading with increasing frequency.

SUMMARY

In one aspect, the present invention exploits the termination conductances of a time-discrete harmonic mixer as another degree of freedom in configuring the mixer to meet given harmonic rejection performance requirements while using a reduced number of unit cells. The values of the termination conductances are purposefully chosen to introduce a desired non-linearity in quantization of the mixer transconductance by the unit cells. The non-uniform quantization produces a non-linear fitting of the transconductance levels made available by the mixer to the transconductance points defining the target sinusoidal waveform. As a consequence of its termination conductance configuration, the contemplated mixer achieves levels of harmonic rejection with that would not be met if the reduced number of unit cells operated with uniform quantization. As a further advantage, the manipulated conductance values generally are lower than those used in conventional designs, e.g., on par with the maximum conductance of the mixer, $G_m$.

Thus, in one embodiment herein, a time-discrete harmonic rejection mixer circuit comprises a parallel set of N unit cells that quantize a mixer transconductance into N+1 selectable levels, each level selectable by application of a corresponding digital control word to the set of unit cells. The mixer circuit further includes a mixer input port coupled to one end of the set of unit cells through a source termination conductance, and a mixer output port coupled to the other end of the set of unit cells through a load termination conductance.

Advantageously, the source and load termination conductances have conductance values producing a designed-for non-uniform quantization of said mixer transconductance by the set of unit cells, so that a subset of the quantization levels better match a set of nominal transconductance points corresponding to a desired sinusoidal Local Oscillator (LO) waveform than would be achieved with a uniform quantization of the mixer transconductance.

Correspondingly, the mixer circuit includes a digital sequencer configured to store or otherwise generate a sequence of digital control words corresponding to the subset of quantization levels. The digitizer and/or an associated control unit, is further configured to apply said sequence of digital control words to the set of unit cells at a timing corresponding to a frequency of the sinusoidal LO waveform.

In another aspect, the teachings presented herein disclose a method of configuring a time-discrete harmonic rejection mixer circuit. Here, a number N of unit cells are operable to quantize a mixer transconductance into a number of quantization levels fixed by the number N of unit cells and it will be understood that in the intended mixer circuit operation, the unit cells are dynamically sequenced through a series of those quantization levels, to obtain a sinusoidally varying mixer transconductance.

In essence, the configuration method "looks" for mixer termination conductance values that are within a reasonable range, as regards practical circuit realization, and that cause a beneficial non-linearity in the quantization function performed by the unit cells, so that the non-uniformly quantized levels of mixer transconductance available from the unit cells follow a curve that better fits the nominal transconductance points associated with the desired sinusoidal waveform. Here, "better fits" should be understood as expressing the relative improvement in fitment as compared to that would be obtained with conventional, uniform quantization of the mixer transconductance. It should also be understood that the method is executed by a computer system, having data input and output mechanisms and a central processing unit or other such digital processor, so that the requisite starting variables are provided as data inputs for use in the configuration computations, and so that the configuration results can be output for inspection and/or recording in a computer readable medium, e.g., disk and/or memory.

With these points in mind, the configuration method includes receiving input values for the following variables: the number N of unit cells, the number R of sample points used to model one period of the target sinusoidal waveform, the phase offset value desired for the target sinusoidal waveform, a first conductance value representing a source termination conductance of the mixer circuit, and a second conductance value representing a load termination conductance of the mixer circuit.

The method further includes performing a configuration analysis based on the above-provided starting variables. That analysis includes: computing a set of quantized alpha ($\alpha$) values as $\alpha \epsilon E=[-1, -1+2/N, -1+4/N, \ldots 1-2/N, 1]$; computing a set of quantized mixer transconductance ($g_m$) values as $g_m \propto \cos(2\pi k/R)$, where $k=\{0, 1, 2, \ldots, R-1\}$, and normalizing $g_m$ as $g_m N = g_m/\max(g_m)$; generating a sampled reference sinusoid (sine) as a function of R and the phase offset, and normalizing the reference sinusoid as sine $N$=sine/max(sine); mapping samples of sine N to nearest samples of $g_m N$, to produce a sequence sine NQ; and computing the spectral content of sine NQ.

With the above "run" of the configuration analysis completed, the method proceeds with comparing the computed spectral content generated in the configuration analysis to a harmonic rejection performance requirement, and recording the first and second conductance values as usable termination conductance values for configuring the mixer circuit when the computed spectral content meets the harmonic rejection performance requirement. Further, responsive to the computed spectral content not meeting the harmonic rejection performance requirement, the method includes repeating the configuration analysis one or more times with adjusted values of one or both of the first and second conductance values, to find first and second conductance values that result in the computed spectral content meeting the harmonic rejection performance requirement. This can be understood as finding optimal terminations for the mixer by sweeping the source and/or load terminations over a range of conductances, while holding the other operational parameters fixed, e.g., fixed values for the number of unit cells, the number of samples R, and the phase offset.

Of course, the present invention is not limited to the above features and advantages. Indeed, those skilled in the art will recognize additional features and advantages upon reading the following detailed description, and upon viewing the accompanying drawings.

DETAILED DESCRIPTION

Figure 1:
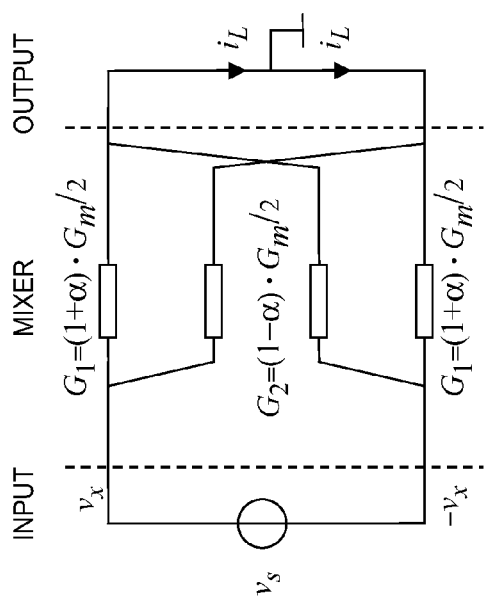
FIG. 1 is a block diagram of a known harmonic rejection mixer having ideal terminations.
Figure 2:
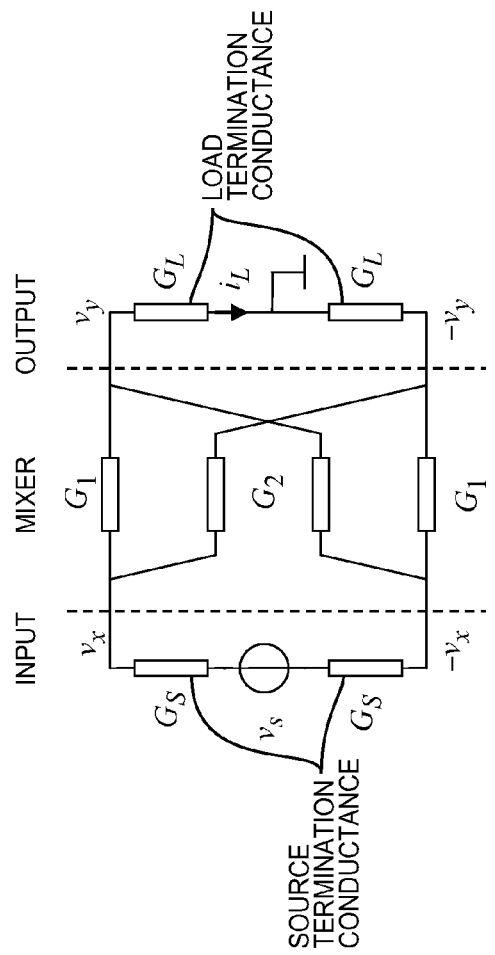
FIG. 2 is a block diagram of a known harmonic rejection mixer having non-ideal terminations that are, nonetheless, configured to be as close to ideal as is practical.
Figure 3:
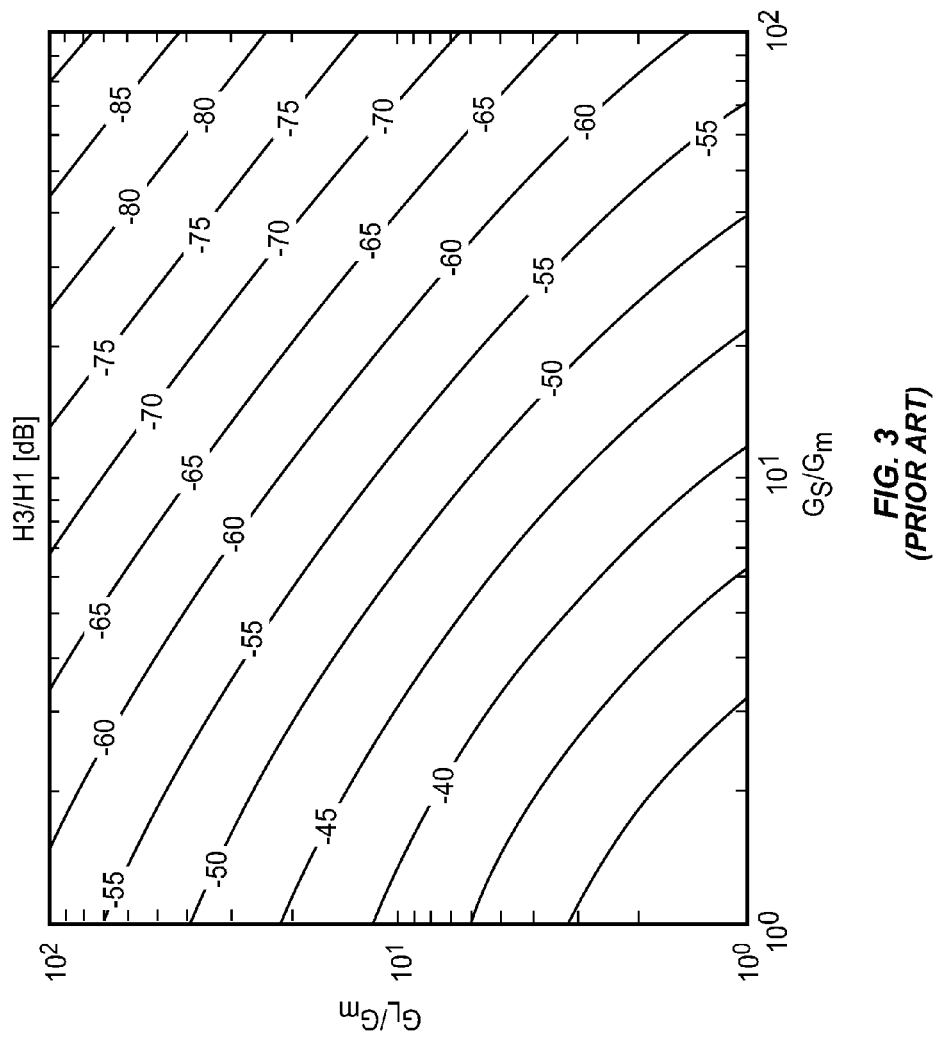
FIG. 3 is a plot of example harmonic rejection performance as a function of mixer terminations.
Figure 5:
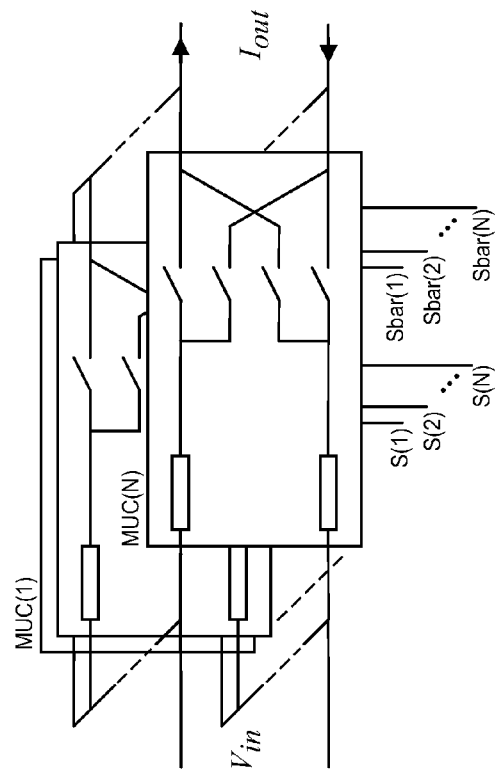
FIGS. 4 and 5 are block diagrams of known unit cell configurations, as used in the time-discrete harmonic rejection mixers at issue in this disclosure.
Figure 4:
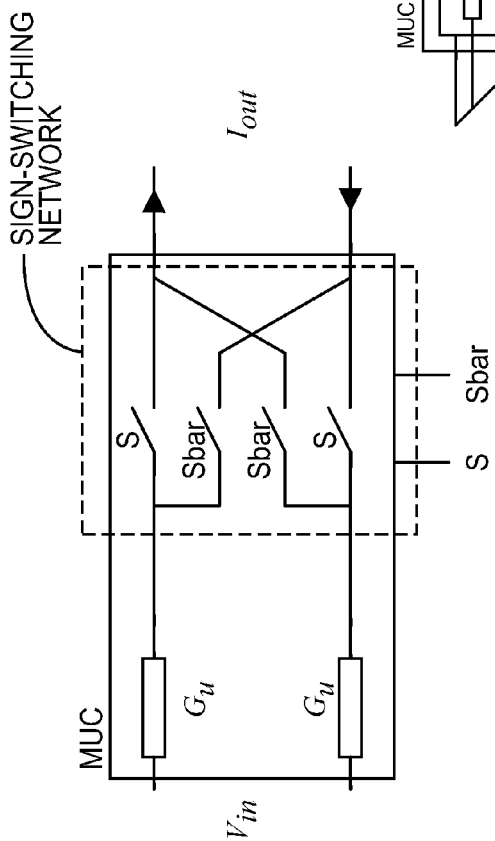
Figure 6:
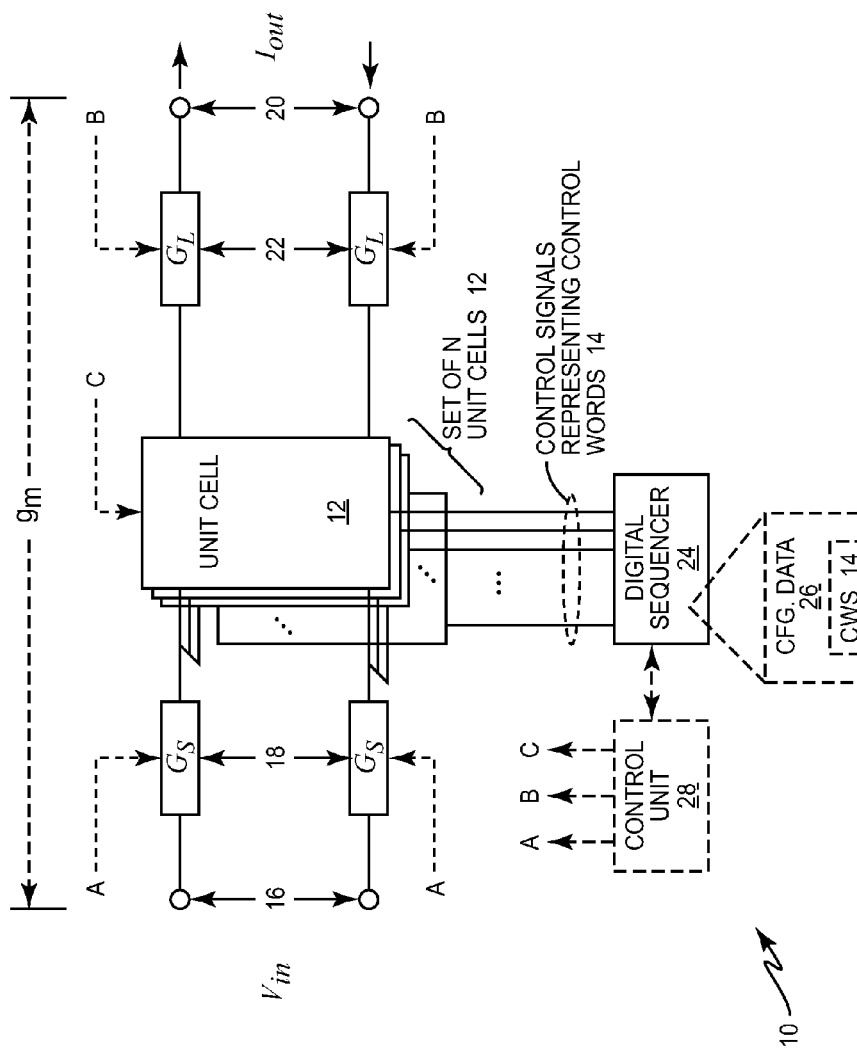
FIG. 6 is a block diagram of one embodiment of a time-discrete harmonic rejection mixer circuit according to the present invention.

FIG. 6 illustrates one embodiment of a time-discrete harmonic rejection mixer circuit 10 as contemplated herein. The time-discrete harmonic rejection mixer circuit 10 (hereafter "mixer 10") includes a parallel set of N unit cells 12 that are operative to quantize the mixer's transconductance into N+1 selectable levels, each level selectable by application of a corresponding digital code word 14 to the set of unit cells 12.

According to the example details, the mixer 10 further includes a mixer input port 16 coupled to one end of the set of unit cells 12 through a source termination conductance 18. Correspondingly, the mixer 10 includes a mixer output port 20 coupled to the other end of the set of unit cells 12 through a load termination conductance 22. The values of these conductances deviate from conventional designs that use termination conductances large enough to approximate the ideal termination case.

Instead, the source and load termination conductances 18 and 22 here have conductance values chosen to produce a desired non-uniform quantization of the mixer transconductance—indicated as "$g_m$" in the diagram—by the set of unit cells 12, so that a subset of the quantization levels better match a set of nominal transconductance points corresponding to a desired sinusoidal Local Oscillator (LO) waveform than would be achieved with a uniform quantization of the mixer transconductance $g_m$. That is, the non-uniform quantization results in a better curve fitting of the quantization levels produced by the application of particular ones of the code words 14 to the nominal transconductance points of the target sinusoidal waveform than would be provided by a set of uniform quantization levels.

The mixer 10 further includes a digital sequencer 24 that is configured to store or otherwise generate a sequence of the digital control words 14 corresponding to the subset of ("fitted") quantization levels. That is, the sequencer 24 stores or generates those digital code words 14 corresponding to the particular subset among the N+1 quantization levels that are to be used for sinusoidally varying the mixer's transconductance at the desired LO frequency and phase. The sequencer 24 is further configured to apply that sequence of digital control words 14 to the set of unit cells 12 at a timing corresponding to a frequency of the sinusoidal LO waveform. In the example case of R transconductance points defining the target sinusoidal transconductance of the mixer 10, the sequencer 24 provides a corresponding sequence of R control words 14 for every period of the LO.

The configuration of the mixer 10 thus allows it to meet a level of harmonic rejection with its N unit cells 12 that would not be met if the quantization function implemented by control of those cells 12 was linear and correspondingly provided uniform quantization levels of the mixer transconductance. The termination conductance values are chosen to introduce a purposeful non-linearity into the quantization function implemented by the unit cells 12, thereby resulting in series of non-uniformly spaced transconductance levels that are better fitted to a nominal series of transconductance points representing the sinusoidal waveform desired for the mixer transconductance.

Figure 7:
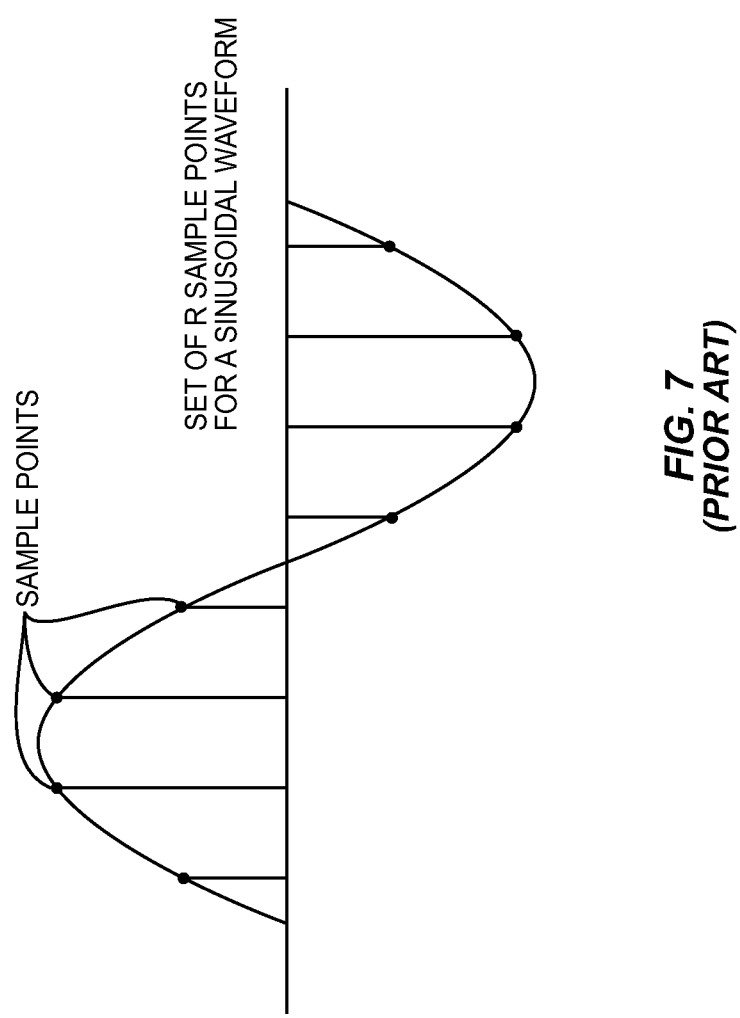
FIG. 7 is a diagram of an example set of sample points for a target sinusoidal waveform, representing the sinusoidal variance in mixer transconductance desired for the mixer of FIG. 6.
Figure 8:
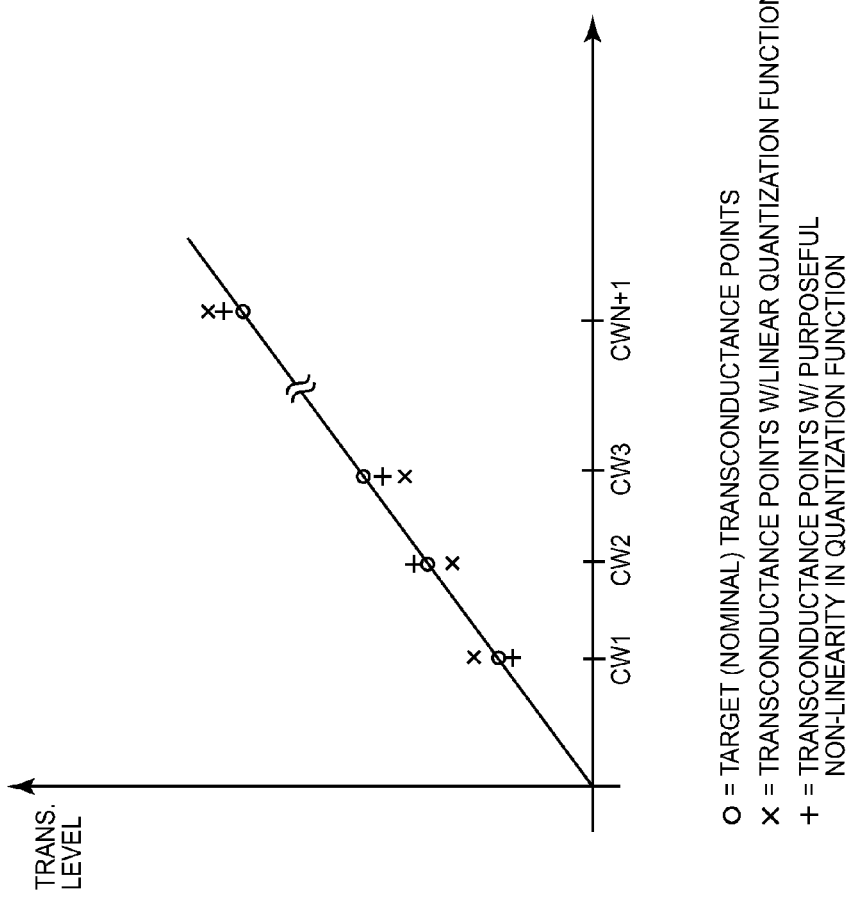
FIG. 8 is a diagram of an example non-linear mapping of digital control words to quantized levels of mixer transconductance, for the mixer of FIG. 6.

The applied sequence of digital code words 14 thus corresponds to the series of non-uniformly spaced transconductance levels that best match the transconductance points of the desired sinusoidal waveform. FIG. 7 illustrates an example set of such points, where a sinusoidal waveform is represented by R sample points, and FIG. 8 illustrates how non-uniformly quantized transconductance levels may, with the proper selection of the source and/or load conductances 18 and 22, better match the nominal transconductance points of the desired sinusoidal waveform.

In at least one embodiment of the mixer 10, the source and load termination conductances 18 and 22 are equal. In one or more other embodiments, the source and load termination conductances 18 and 22 are unequal. In either case, unlike conventional designs, the source and termination load conductances 18 and 22 do not have values much, much larger than $G_m$, which is done by convention to substantially eliminate their influence on mixer transconductance. Instead, they are chosen to have specific values that are, for example, within the general range of $G_m$, and that produce a beneficial, targeted non-linearity in the quantization function, resulting in quantized transconductance levels that better fit the nominal transconductance points.

Figure 9:
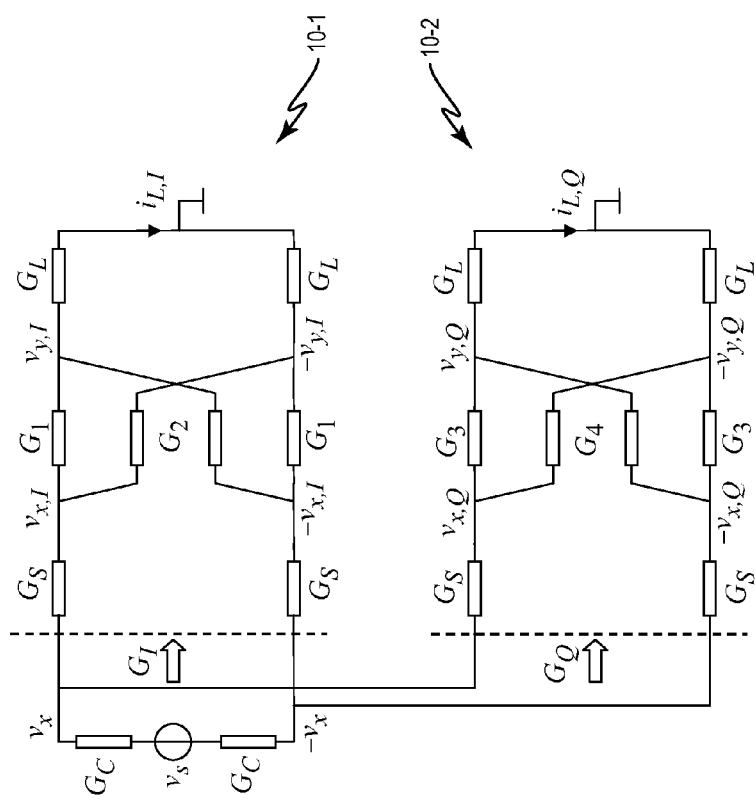
FIG. 9 is a block diagram for a quadrature mixer embodiment.

In the same or other embodiments, the mixer 10 comprises a first one of two nominally identical mixer circuits configured to operate as quadrature mixers with respect to a common source or load. FIG. 9 illustrates an example of such an arrangement, involving like mixers 10, e.g., 10-1 and 10-2. Quadrature-mode performance is discussed in more detail later herein.

In any case, a single mixer 10 as contemplated herein causes a non-linearity of the transconductance quantization function implemented by the unit cells 12, by lowering the value(s) of source and/or load termination conductances 18 and 22, such that they no longer satisfy the conventional design constraint of $G_S G_L \gg G_m$. This allows, for example, the source and load termination conductances 18 and 22 to be of the same order as $G_m$, thus making it possible to use practical transconductance values in the mixer design.

Further practical flexibility is provided in one or more embodiments, such as where the mixer 10 is configured to use different phase offsets. For example, the above-described sequence of digital control words 14 corresponding to the subset of the quantization levels best matching the desired transconductance points may be a first sequence representing a first phase offset for the desired sinusoidal LO waveform. The digital sequencer 24 in at least one embodiment is configured to store or generate one or more additional sequences representing one or more additional phase offsets, and to select one of the sequences as indicated by a phase control signal input to the digital sequencer, e.g., by the control unit 28.

In the same or other embodiments, the digital sequencer 24 or the associated control unit 28 is configured to control the mixer 10 to operate with a programmable number of waveform samples per LO period. For each programmable number of samples R, the mixer 10 is configured to use at least one of: a different number of unit cells 12, different phase offsets, and different values for the source and load termination conductances 18 and 22. Note that the digital sequencer 24 and/or the control unit 28 may store configuration data 26, including the various sequences of control words 14, phase offsets, termination conductance adjustments, etc. In such operations, the control unit 28 may output control signals, e.g., A, B, and C, to control or otherwise configure the programmable values of the source and load termination conductances 18 and 22 (control signals A and B, respectively), and the number of unit cells 12 that are selected for use in quantization (control signal C). For example, depending on the number of waveform samples R and offset, the mixer 10 may or may not use all of its available unit cells 12 for quantization. Thus, "N" represents the number of unit cells 12 being used to quantize the mixer transconductance in any given operational configuration, but N is not necessarily all of the unit cells 12 available in the mixer 10.

To better understand the contemplated mixer 10, consider that the normalized mixer transconductance is $$\frac{g_m(\alpha)}{g_m(1)}.$$

Figure 10:
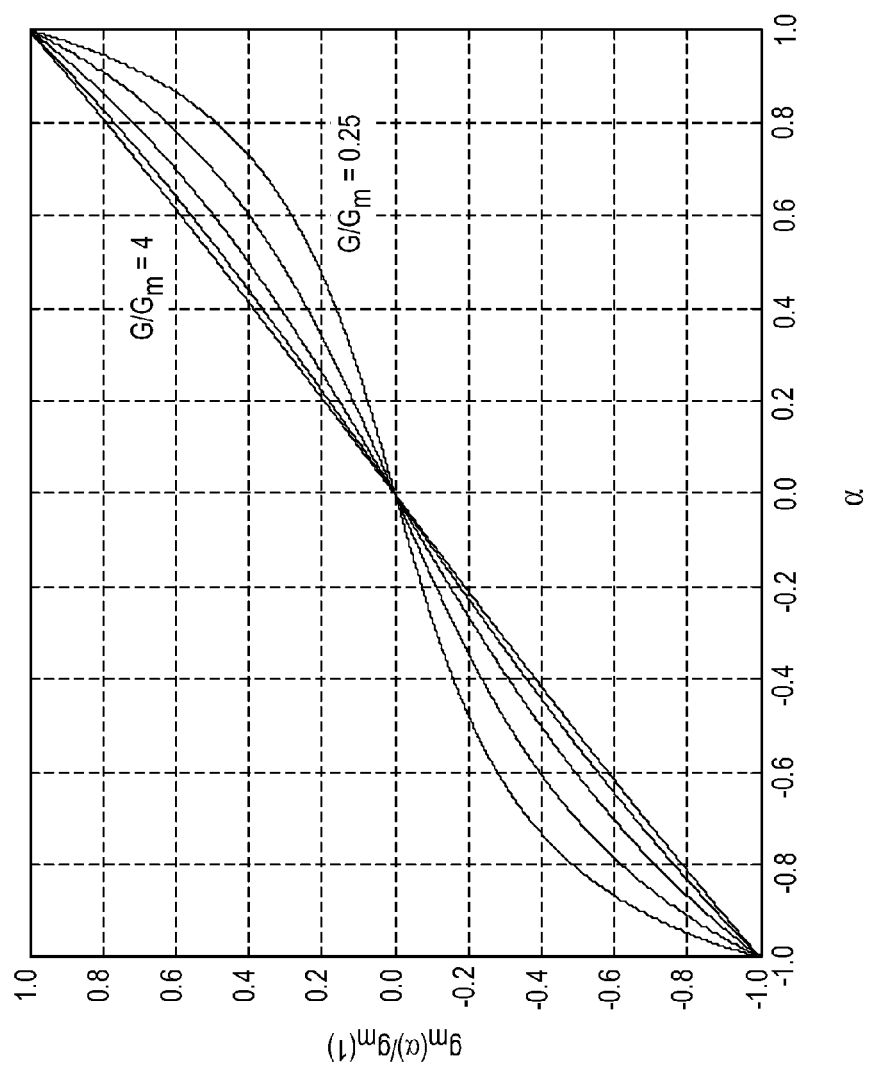
FIG. 10 is a diagram of example non-linearity in the relationship between mixer transconductance and alpha, as is purposefully introduced via configuration of mixer termination conductances.

FIG. 10 plots the normalized conductance, $g_m(\alpha)/g_m(1)$, for $G/G_m = [0.25\ 0.5\ 1\ 2\ 4]$, where $G = G_L = G_S$. For the sake of clarity it is assumed that $G_m = 1$. FIG. 10 thus illustrates mixer transconductance as a function of $\alpha$ for various termination conductance values (0.25, 0.5, 1, 2, 4) and highlights the advantageous non-linearity imposed herein between $\alpha$ and $g_m(\alpha)$.

With N unit cells 12, $\alpha$ will be equidistantly discretisized into N+1 levels over $\alpha \in [-1, 1]$, which in turn gives a non-equidistant—non-uniform—discrete set of mixer transconductances, also referred to as transconductance levels.

Figure 11:
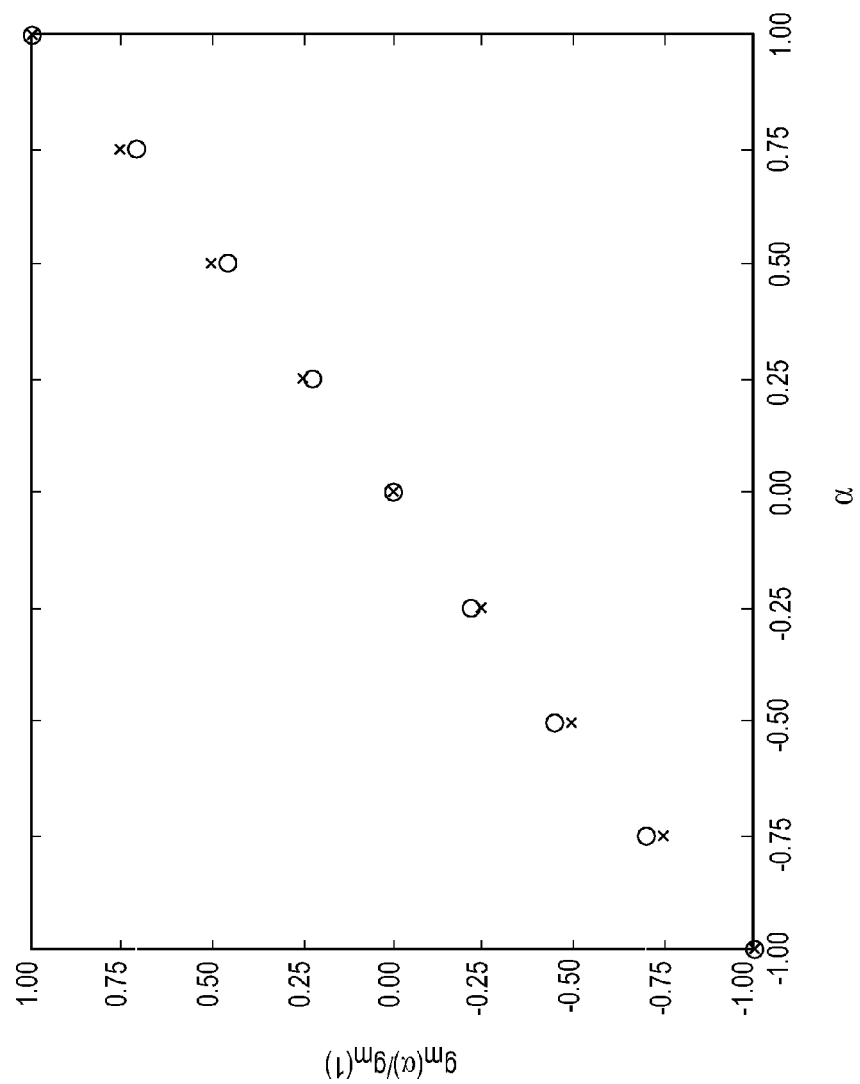
FIG. 11 is a diagram plotting actual mixer transconductance points optimized to desired values {0, ±0.707, ±1} by proper selection of termination conductance values.

Assume an LO period represented by R=8 samples such that $g_m \propto \cos(2\pi k/R)$ with k=0, 1 . . . 7. Furthermore assume N=10. With ideal termination—ideal values of the source and load termination conductances 18 and 22—the mixer transconductance levels becomes equidistant as is conventional, such that $g_m/g_m(1) \in [-1, -0.75, \ldots, 0.75, 1]$. These are illustrated with crosses (x) in FIG. 11. However, to represent a sinusoidal normalized transconductance $g_m/g_m(1) \in [-1, -0.707, 0, 0.707, 1]$, the termination conductances can for example be set to $G = G_L = G_S = 1.86$, which then yields the points indicated by circles (o) in FIG. 11. Thus, FIG. 11 illustrates mixer transconductance points optimized to desired values $\{0, \pm 0.707, \pm 1\}$ through proper selection of termination conductance values for the source and/or load termination conductances 18 and 22.

For each number of samples per LO period, it is possible to identify the configurations that fulfil a desired level of harmonic rejection, based on making an exhaustive search through values of N (the number of unit cells 12), various phase offsets $\phi$, and various termination conductances. The phase offset $\phi$ is defined by the mixer transconductance as $g_m \propto \cos(2\pi k/R + \phi)$, and another degree of freedom is obtained by allowing $G_S$ and $G_L$ to be different.

In the search for configurations it is possible to include implementation restrictions. For example: the allowed number N of unit cells 12 should be kept below a certain level to maintain a reasonable circuit complexity; and the termination conductances may need to be implemented completely or partly based on conductance elements in an integrated circuit portion of the mixer 10 for matching purposes, which in turn leads to a limited set of available termination conductances.

Figure 12:
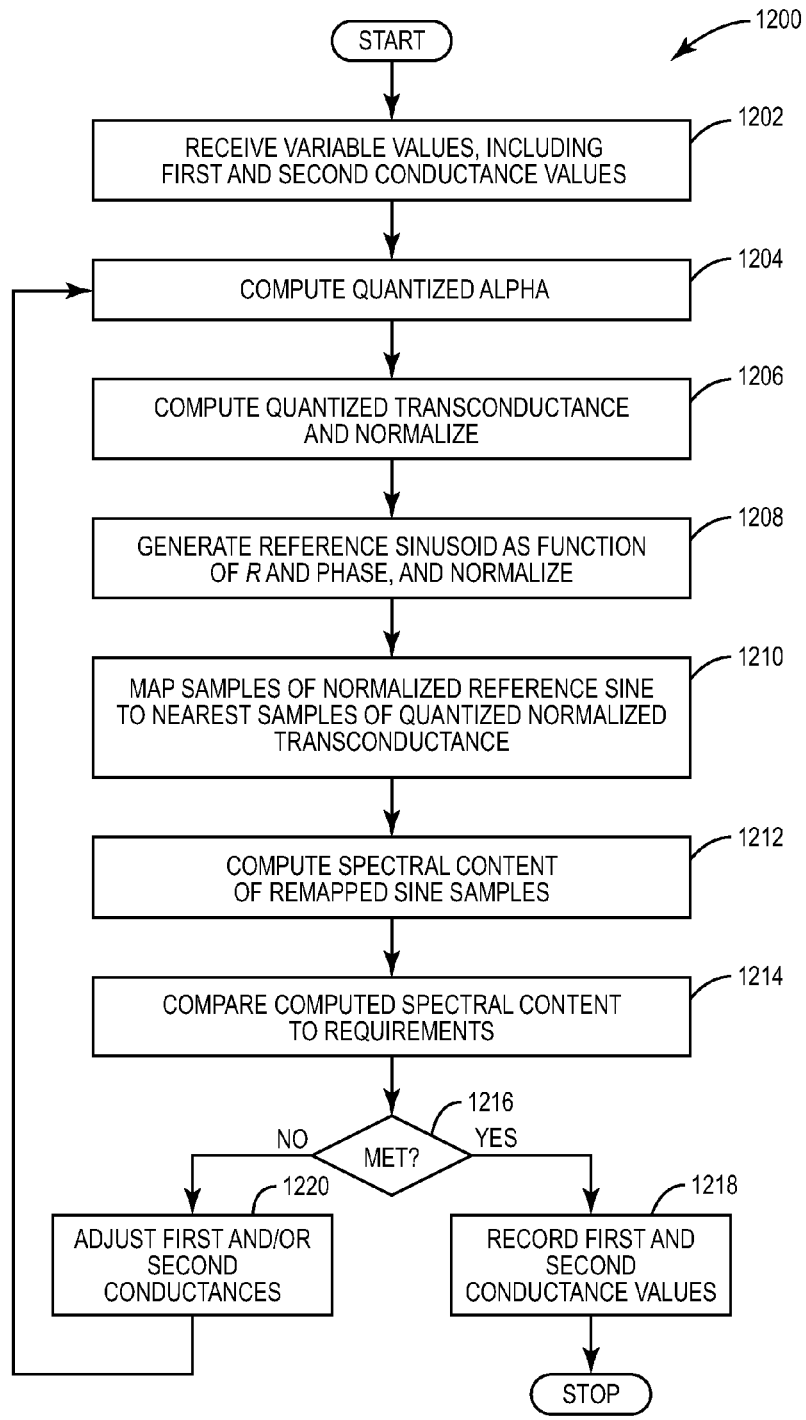
FIG. 12 is a logic flow diagram of one embodiment of a method of optimizing mixer termination conductances.

FIG. 12 illustrates an example method 1200 for finding optimal configurations of a mixer 10, including selection of the source and load termination conductances 18 and 22 to obtain a desired, purposeful non-linearity in the transconductance quantization function, for better matching of the transconductance levels from N unit cells 12 to nominal transconductance points in the target sinusoid waveform. The method 1200 is implemented, for example, in a computer system executing computer program instructions stored in a computer readable medium, e.g., a PC running a computer program product configured to perform the illustrated processing steps.

The method 1200 is directed to configuring a time-discrete harmonic rejection mixer circuit in which a number N of unit cells 12 are operable to quantize a mixer transconductance into a number of quantization levels fixed by the number N of unit cells 12 and where, in mixer circuit operation, the unit cells 12 are dynamically sequenced through a series of the quantization levels to obtain a sinusoidally varying mixer transconductance.

In the illustrated embodiment, the method 1200 includes receiving (Block 1202) input values for the following variables: the number N of unit cells, a number R of sample points used to model one period of the target sinusoidal waveform, a phase offset value for the target sinusoidal waveform, a first conductance value representing a source termination conductance 18 of the mixer 10, and a second conductance value representing a load termination conductance 22 of the mixer 10.

The method 1200 further includes performing a configuration analysis, including execution of Blocks 1204 through 1212 (even). These actions include: computing a set of quantized alpha ($\alpha$) value as $\alpha \in [-1, -1+2/N, -1+4/N, \ldots 1-2/N, 1]$ (Block 1204); computing a set of quantized mixer transconductance ($g_m$) values as $g_m \propto \cos(2\pi k/R)$, where $k = \{0, 1, 2, \ldots, R-1\}$, and normalizing $g_m$ as $g_m N = g_m/\max(g_m)$ (Block 1206); generating a sampled reference sinusoid (sine) as a function of R and the phase offset, and normalizing the reference sinusoid as sine $N = $ sine/max(sine) (Block 1208); and mapping samples of sine N to nearest samples of $g_m N$, to produce a sequence sine NQ (Block 1210).

Processing according to the method 1200 continues with computing the spectral content of sine NQ (Block 1212), and comparing the spectral content computed in the configuration analysis to a harmonic rejection performance requirement (which may be user-defined or otherwise configured) (Block 1214). Processing then continues with evaluating (Block 1216) the results of the comparison.

If the requirements are met, the method 1200 includes recording the first and second conductance values as usable termination conductance values for configuring the mixer 10 (Block 1218). On the other hand, if the computed spectral content does not meet the harmonic rejection performance requirement (NO from 1216), the method 1200 includes adjusting the values for one or both of the first and second conductance values (Block 1220) and repeating the configuration analysis one or more times using the adjusted values for each repetition. Such processing finds first and second conductance values that result in the computed spectral content meeting the harmonic rejection performance requirement, and thus identifies actual conductance values for use as termination conductances 18 and 22 in the mixer 10, to obtain the desired quantization non-linearity.

The method 1200 is presented in alternate form in the below pseudo code:

```
For a given number of samples per LO period R
  for each number of unit cells N
    for each source termination GS
      for each load termination GL
        for each phase offset φ
          evaluate configuration:
            1. Given N; define available α: (-N:2:N)/N
            2. Given GS,GL,GM,α: calculate available gm
            3. Normalize: gmN=gm/max (gm)
            4. Given R and φ: Generate sampled sinusoid, sine
            5. Normalize: sineN=sine/max(sine)
            6. Map sineN samples to nearest gmN samples to give
               sequence sineNQ
            7. Calculate spectral content of sineNQ
        endfor
      endfor
    endfor
  endfor
```

Identify configurations fulfilling requirements
Choose final mixer configuration according to additional conditions Thus, all configurations available are investigated by evaluating the performance, e.g. with respect to levels of specific harmonics or multiple harmonics combined. After evaluation, those configurations fulfilling the performance requirements are collected and, based on these, additional selection criteria may be applied to obtain a final mixer configuration.

In an application where the number of samples per LO period is programmable the above search may be repeated for each number of samples R per LO period. This leads to a mixer 10 that, in dependence on the number of samples per period, will use at least one of: a different number N of unit cells 12, different phase offsets, and/or different termination conductances values.

The results discussed in the following paragraphs were obtained using the above optimization method, i.e., they are given based on exhaustive searches for a few different numbers of samples per period R. The phase offset was swept in steps of 0.2 deg, the number N of unit cells 12 was swept from 4 to 20, and the source and load termination conductances $G_S = G_L$ were swept from 1 to 20 in $\Delta G = 0.05$ steps. Each plot shows Total Harmonic Distortion (THD) defined as the accumulated harmonic power up to harmonic R−2 (the first sampling image appears at harmonic R−1).

The plots are shown below together with their corresponding tables containing optimal configurations for each N. Configurations in the tables with THD<−60 dBc are in bold. It is readily seen that the difference between the optimized and non-optimized configurations are often dramatic, although the configurations yielding very low THD (<−60 dBc) become fewer for increasing R.

Figure 13:
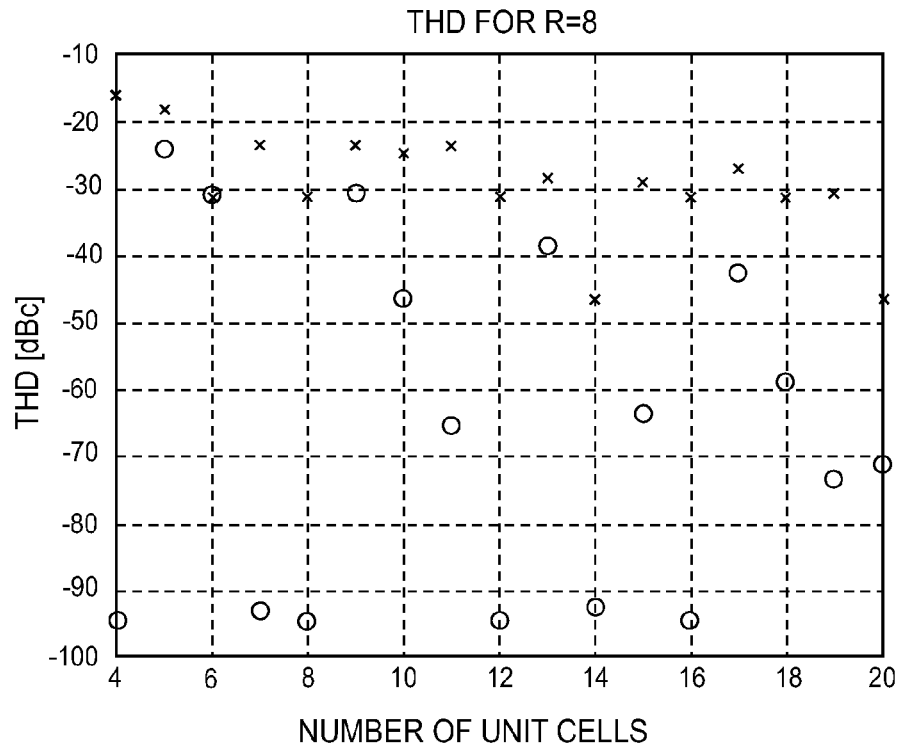
FIG. 13 is an example diagram plotting Total Harmonic Distortion (THD) for an example case using R=8 waveform samples, with (x) representing a non-optimized and ideally terminated mixer configuration and (o) representing an optimized mixer configuration, as taught herein, with $\Delta G=0.05$.

FIG. 13 illustrates THD for R=8 with (x) representing non-optimized and ideally terminated mixer configurations and (o) representing an optimized mixer configuration with $\Delta G = 0.05$. Here, and elsewhere below, the optimized configuration is the one using non-ideal source and/or load termination conductances 18 and 22 that are purposefully chosen to influence the mixer transconductance quantization, to yield an improved matching between the transconductance levels used to by the mixer and the corresponding nominal transconductance points of the desired sinusoidal waveform.

Figure 14:
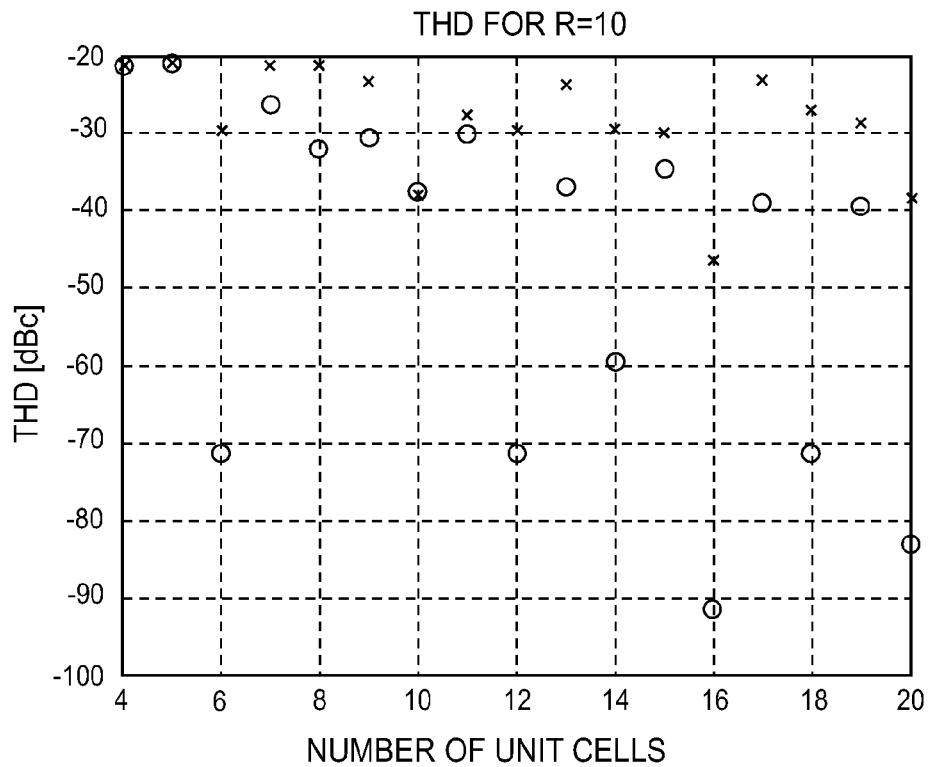
FIG. 14 is an example diagram plotting THD for R=10 with (x) representing a non-optimized and ideally terminated mixer configuration and (o) representing an optimized mixer configuration, as taught herein, with $\Delta G=0.05$.

FIG. 14 illustrates THD for R=10 with (x) representing a non-optimized and ideally terminated mixer configuration and (o) representing an optimized mixer configuration with $\Delta G = 0.05$.

Figure 15:
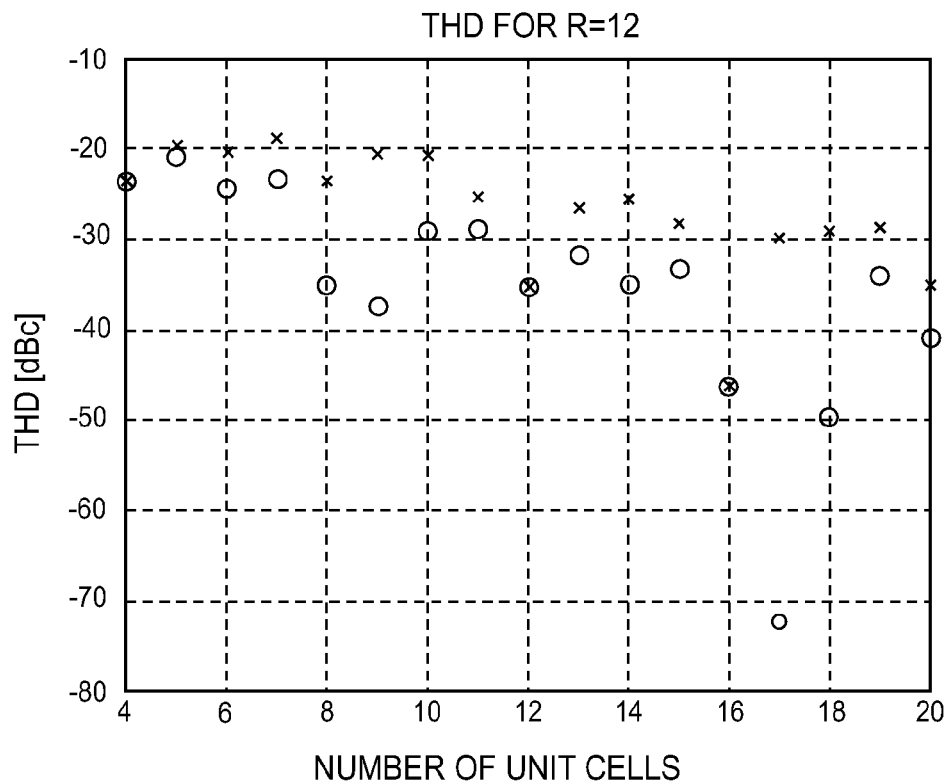
FIG. 15 is an example diagram plotting THD for R=12 with (x) representing a non-optimized and ideally terminated mixer configuration and (o) representing an optimized mixer configuration, as taught herein, with $\Delta G=0.05$.

FIG. 15 illustrates THD for R=12 with (x) representing a non-optimized and ideally terminated mixer configuration and (o) representing an optimized mixer configuration with $\Delta G = 0.05$.

It may be desired to implement the source and load termination conductances 18 and 22 based on a conductance unit common with the actual mixer circuitry—e.g., the conductance of the unit cells 12—to reach a high degree of matching and thereby secure robust performance. In such cases, the search scope and the harmonic rejection performance will be more limited. To exemplify this, the above search method 1200 is repeated but now with the source and load termination conductances $G_S = G_L$ swept from 1 to 20 in steps of $\Delta G = 1$, instead of $\Delta G = 0.05$. This restriction leads to no configuration for R=12 that yields THD at −60 dBc or lower.

Figure 16:
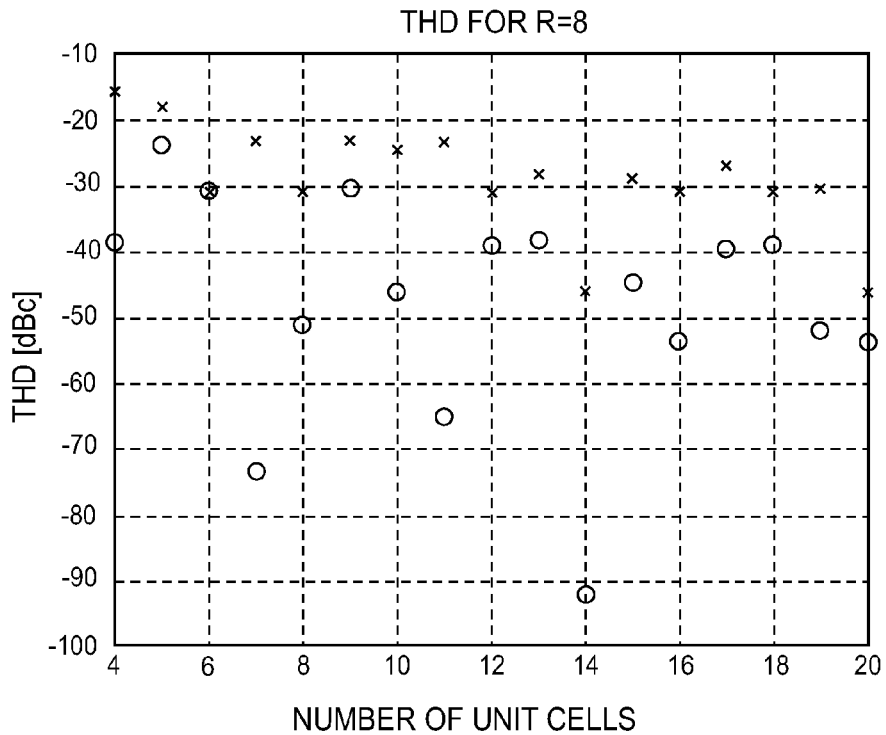
FIG. 16 is an example diagram plotting THD for R=8 with (x) representing a non-optimized and ideally terminated mixer configuration and (o) representing an optimized mixer configuration, as taught herein, with $\Delta G=1$.

With these additional search constraints in mind, FIG. 16 illustrates THD for R=8 with (x) representing a non-optimized and ideally terminated mixer configuration and (o) representing an optimized mixer configuration with $\Delta G = 1$.

Figure 17:
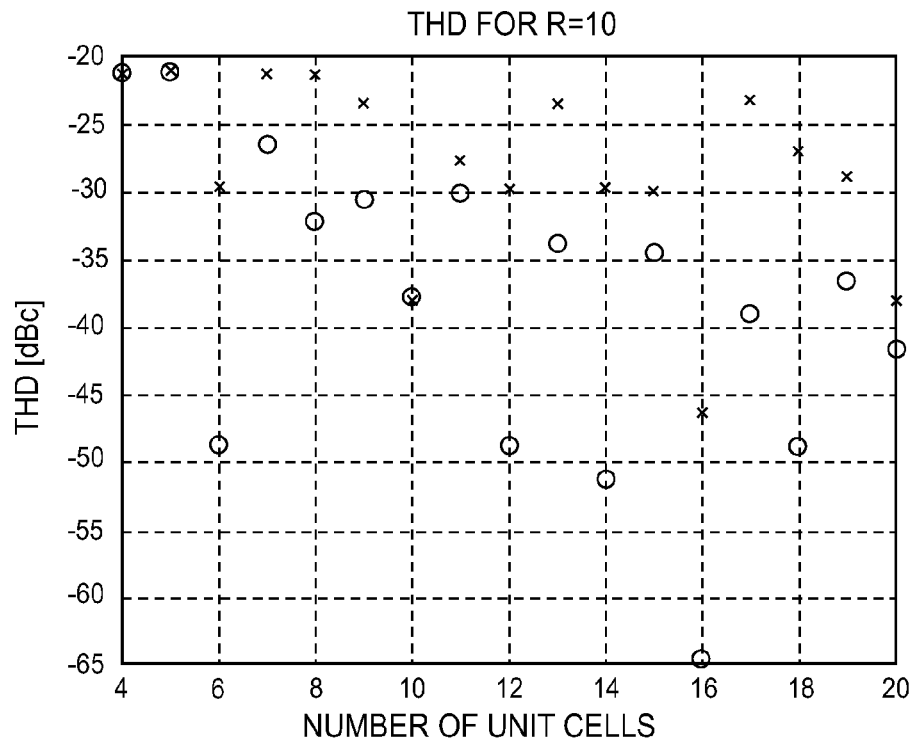
FIG. 17 is an example diagram plotting THD for R=10 with (x) representing a non-optimized and ideally terminated mixer configuration and (o) representing an optimized mixer configuration, as taught herein, with $\Delta G=1$.

FIG. 17 illustrates THD for R=10 with (x) representing a non-optimized and ideally terminated mixer configuration and (o) representing an optimized mixer configuration with $\Delta G = 1$.

Figure 18:
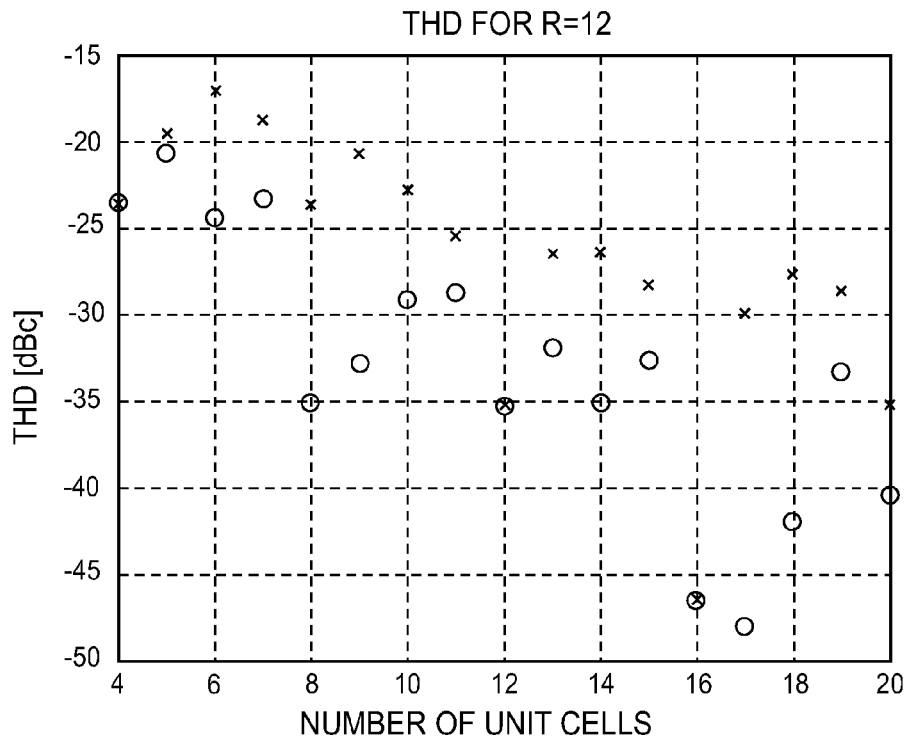
FIG. 18 is an example diagram plotting THD for R=12 with (x) representing a non-optimized and ideally terminated mixer configuration and (o) representing an optimized mixer configuration, as taught herein, with $\Delta G=1$.

FIG. 18 illustrates THD for R=12 with (x) representing a non-optimized and ideally terminated mixer configuration and (o) representing an optimized mixer configuration with $\Delta G = 1$.

Until this point in the examples, the searches have been based on $G_S = G_L$. By allowing independent $G_S$ and $G_L$ while still limiting them by $\Delta G = 1$, the configuration flexibility is increased and more high performance configurations are found. It is also worth noting that the high performance configurations exemplified by these illustrations have termination conductances $G_S$ and $G_L$ being less than ten times the maximum mixer transconductance $G_m$ and lowest N giving −60 dBc THD. Termination conductance has not been larger than four for the cases investigated in the development of this disclosure—i.e., $G_S/G_m, G_L/G_m \leq 4$.

Figure 19:
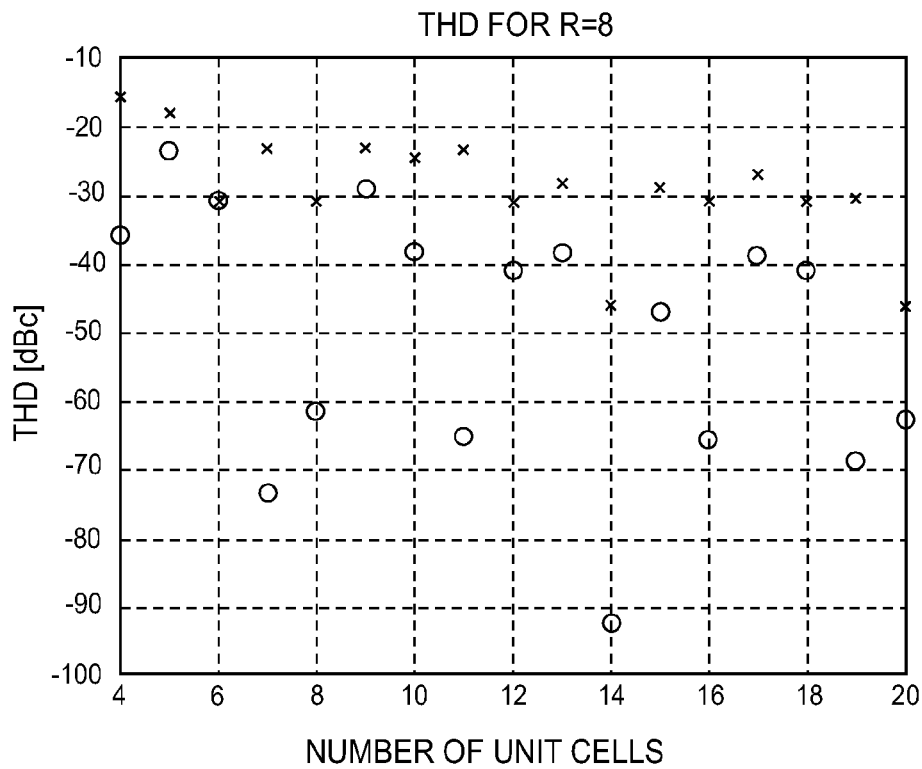
FIG. 19 is an example diagram plotting THD for R=8 with (x) representing a non-optimized and ideally terminated mixer configuration and (o) representing an optimized mixer configuration, as taught herein, with $\Delta G=1$ and with independent values for mixer source and load termination conductances $G_S$ and $G_L$.

Continuing with the examples, FIG. 19 illustrates THD for R=8 with (x) representing a non-optimized and ideally terminated mixer configuration and (o) representing an optimized mixer configuration with $\Delta G = 1$ and independent $G_S$ and $G_L$.

Figure 20:
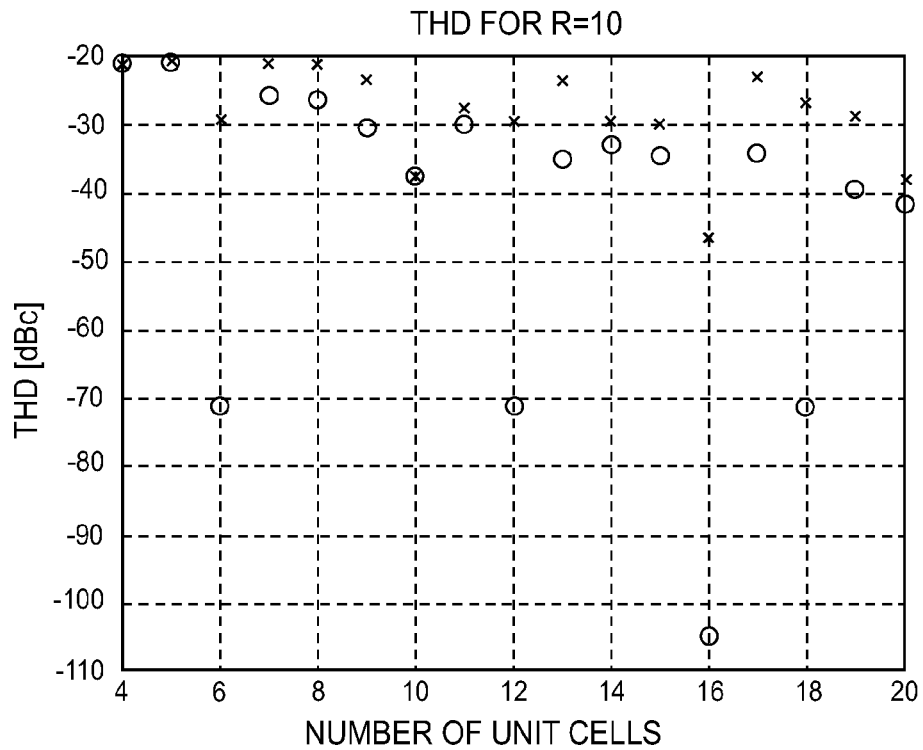
FIG. 20 is an example diagram plotting THD for R=10 with (x) representing a non-optimized and ideally terminated mixer configuration and (o) representing an optimized mixer configuration, as taught herein, with $\Delta G=1$ and with independent values for mixer source and load termination conductances $G_S$ and $G_L$.

FIG. 20 illustrates THD for R=10 with (x) representing a non-optimized and ideally terminated mixer configuration and (o) representing an optimized mixer configuration with $\Delta G = 1$ and independent $G_S$ and $G_L$.

Figure 21:
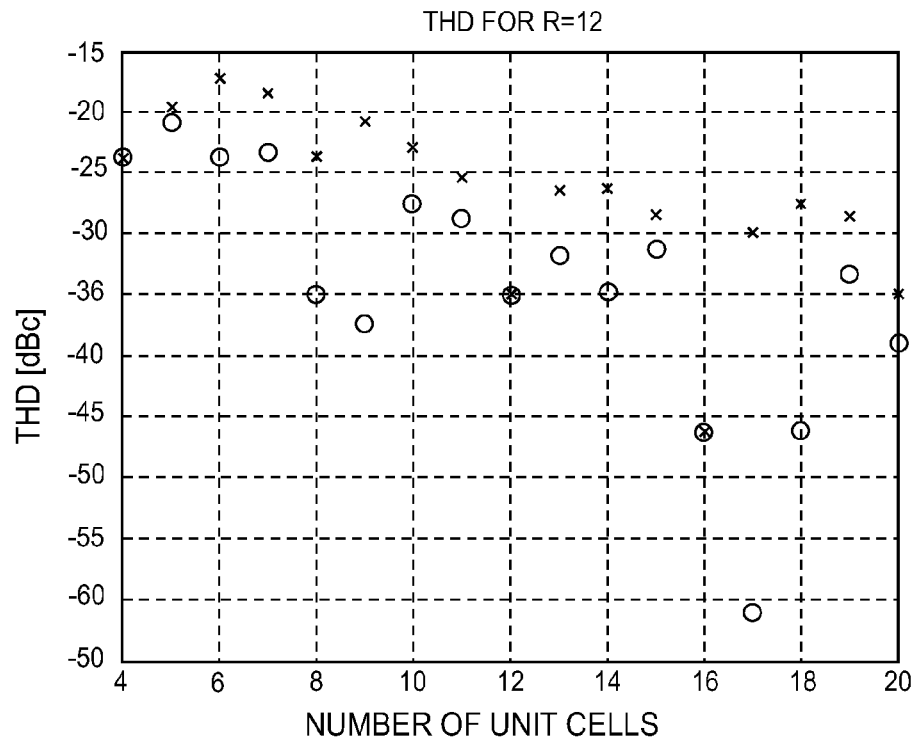
FIG. 21 is an example diagram plotting THD for R=12 with (x) representing a non-optimized and ideally terminated mixer configuration and (o) representing an optimized mixer configuration, as taught herein, with $\Delta G=1$ and with independent values for mixer source and load termination conductances $G_S$ and $G_L$.

FIG. 21 illustrates THD for R=12 with (x) representing a non-optimized and ideally terminated mixer configuration and (o) representing an optimized mixer configuration with $\Delta G = 1$ and independent $G_S$ and $G_L$.

Turning to termination sensitivity, from Eq. (2) it can be seen that the lower the termination transconductances 18 and 22, the greater the effect on the mixer transconductance. This is also readily seen with reference back to FIG. 10, which illustrates the non-linear relationship between a and the normalized mixer transconductance $g_m(\alpha)/g_m(1)$, as produced by the manipulation of the $G_S$ and $G_L$ values—i.e., the purposeful manipulation of the source and load termination conductances 18 and 22.

Figure 22:
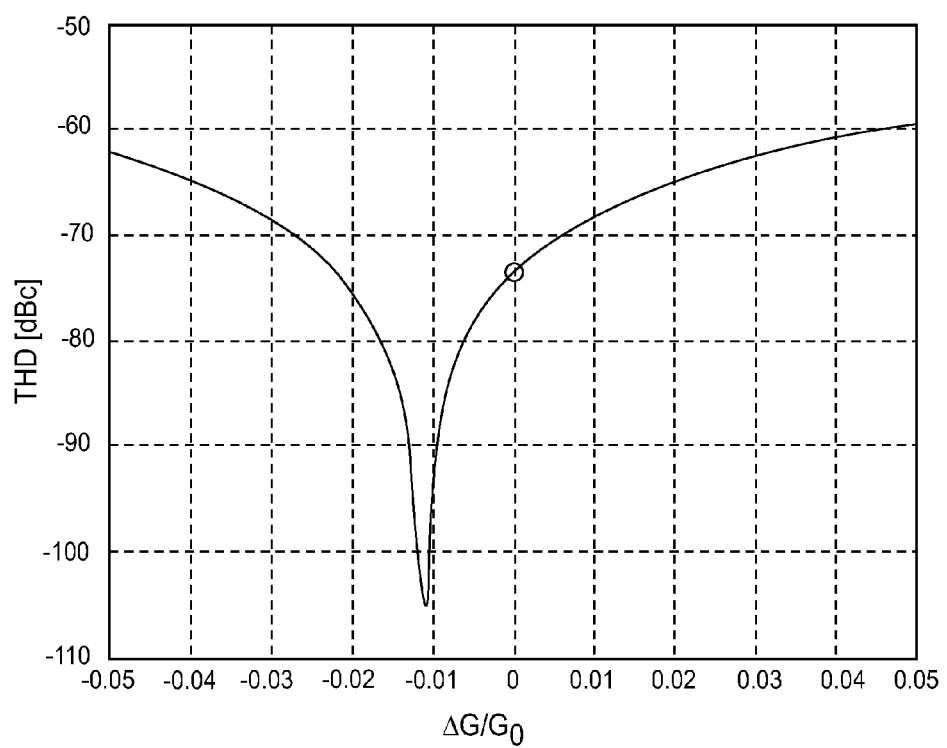
FIG. 22 is an example diagram plotting THD as a function of termination conductance $G=G_L=G_S$ swept around a nominal value.

For R=8 there is one simple configuration with N=7, $G_S = G_L = 4$, and 16.2° phase offset, which leads to less than −70 dBc THD. In the plot illustrated in FIG. 22, THD is shown as a function of $G = G_S = G_L$ being swept over ±5% of the nominal value $G_0 = 4$.

Figure 23:
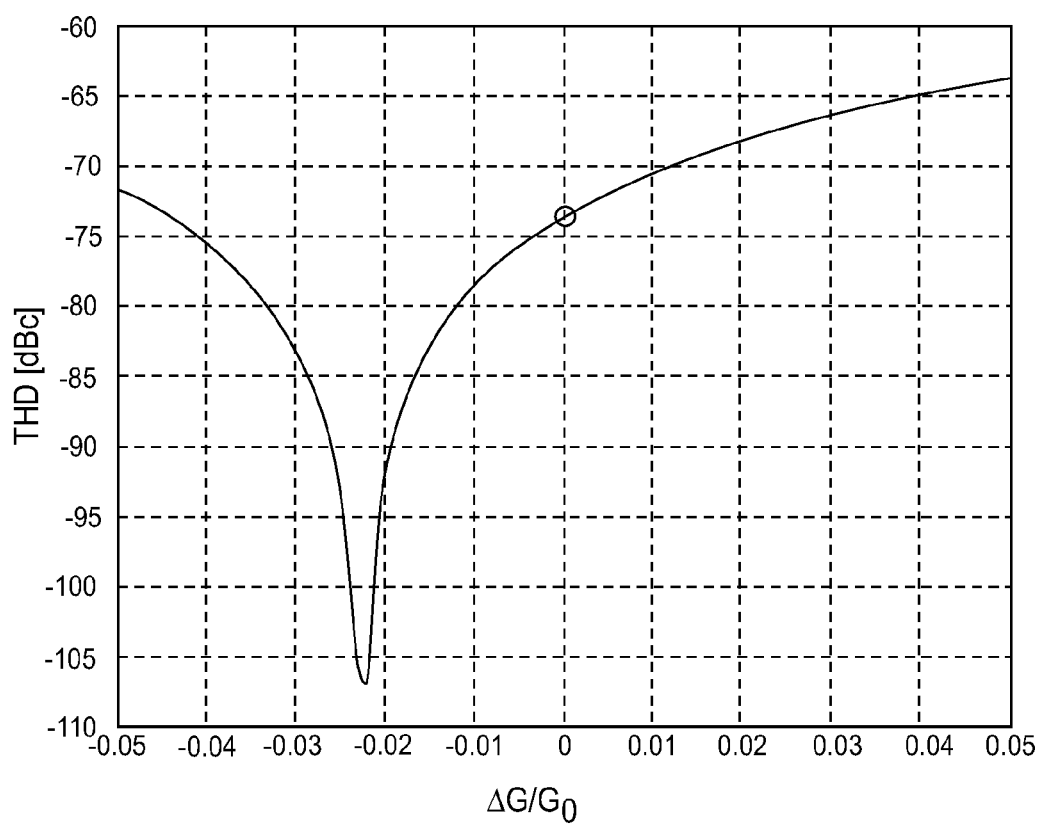
FIG. 23 is an example diagram plotting THD as a function of termination conductance $G=G_L$ swept around a nominal value $G_0=4$, while $G_S$ is fixed to 4.

If only one of $G_S$ and $G_L$ is swept and the other remains at its nominal value, the sensitivity becomes smaller as illustrated in FIG. 23. That is, when the values of $G_S$ and $G_L$ are close to $G_m$, THD is more sensitive w.r.t variations in the values of $G_S$ and $G_L$ as opposed to when the value of $G_S$ and/or $G_L$ is significantly lager than $G_m$. Thus, even with relatively small termination conductances as compared to conventional practice, very low levels of THD can be preserved even though the termination conductance values may vary from their intended values by a few percent.

Using, as does the present invention, termination conductance values that are far from the ideal, does not necessarily consider the effects of having two or more such mixers 10 sharing a common source or a common load, as in quadrature and complex mixers for either up-conversion or down-conversion. Such an arrangement was shown earlier, in FIG. 9.

In conventional designs with termination conductances that are ideal (at least insofar as ideal values are realizable in practice), the mixer port resistances do not vary with α. But when, as in one or more embodiments presented herein, the source and load termination conductances 18 and 22 become on par with the mixer conductance $G_m$, that independence no longer holds. In other words, with the conductance value ranges contemplated herein, mixers 10 sharing a common load or source will affect one another.

Referring back to FIG. 9, the two mixers 10-1 and 10-2 are identical except for the fact that their transconductances are in quadrature such that $$G_1 = (1+\alpha)G_m/2 \quad G_2 = (1-\alpha)G_m/2$$

$$G_3 = (1+\beta)G_m/2 \quad G_4 = (1-\beta)G_m/2$$

where $$\alpha = \cos(2\pi f_{LO} t) \text{ and } \beta = \sin(2\pi f_{LO} t)$$

Assuming that the two mixers 10-1 and 10-2 will operate identically except for the quadrature phase relationship, the uppermost I-branch mixer 10-1 can be re-investigated but now with the additional mixer 10-2 viewed as a time-variable conductance $G_Q$ loading the nodes in common between the two mixers 10. Actually, it is sufficient to consider the first mixer 10-1. The results from first mixer 10-1 will apply to the second mixer 10-2, as long as they are designed and operated identically, with the exception that they have a quadrature phase relationship. In other words, the effect of the second mixer 10-2 on the first mixer 10-1 will be the same as the effect of the first mixer 10-1 on the second mixer 10-2.

Also from FIG. 9, it should be understood that if $G_C \gg G_Q$, $G_I$ there will be little interaction between the two mixers 10-1 and 10-2. Yet, the present invention purposefully uses more reasonable conductance values, and this advantageous usage of practical conductance values can be extended to $G_C$.

Thus, it is contemplated herein to apply the optimization search embodied in the method 1200 to the quadrature mixer configuration of FIG. 9, with the assumption that the second mixer 10-2 is designed and operated identically to the first mixer 10-1, except for the quadrature phase relationship. As shown herein, even with a small $G_C$ and with significant interaction between the quadrature mixers 10-1 and 10-2, there are configurations providing very high levels of harmonic rejection.

Figure 24:
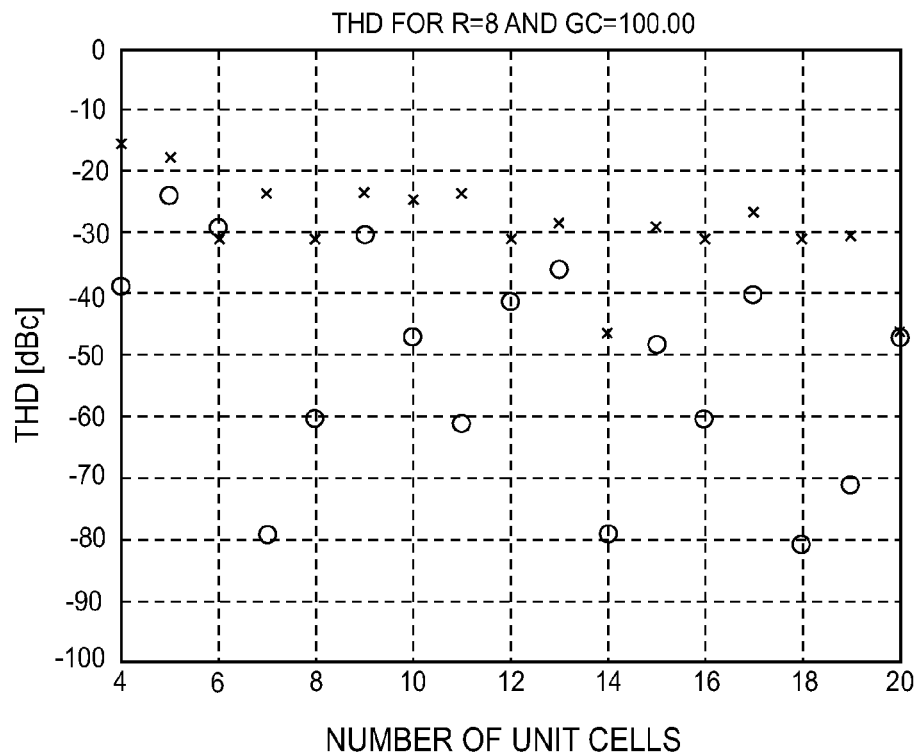
FIG. 24 is an example diagram for the quadrature mixer configuration of FIG. 9, plotting THD for R=8 and (common) $G_C=100$, with (x) representing a non-optimized and ideally terminated mixer configuration and (o) representing an optimized mixer configuration, as taught herein.

FIG. 24 illustrates results based on exhaustive searching with R=8 samples per period. The phase offset was again swept in steps of 0.2 deg, the number N of unit cells 12 was swept from 4 to 20, and the source and load termination conductances $G_S$ and $G_L$ were independently swept from 1 to 5 in ΔG=1 steps. This was repeated for $G_C$=[100 10 1] where the highest number will give the lowest interaction between the mixers 10-1 and 10-2. As the diagram demonstrates, the presence of a second mixer 10-2 in quadrature with the first mixer 10-1 does not meaningfully limit the number of high-rejection configurations that can be found. In the diagram, (x) represents non-optimized and ideally terminated mixer configurations and (o) represents optimized mixer configurations according to the teachings presented herein.

Figure 25:
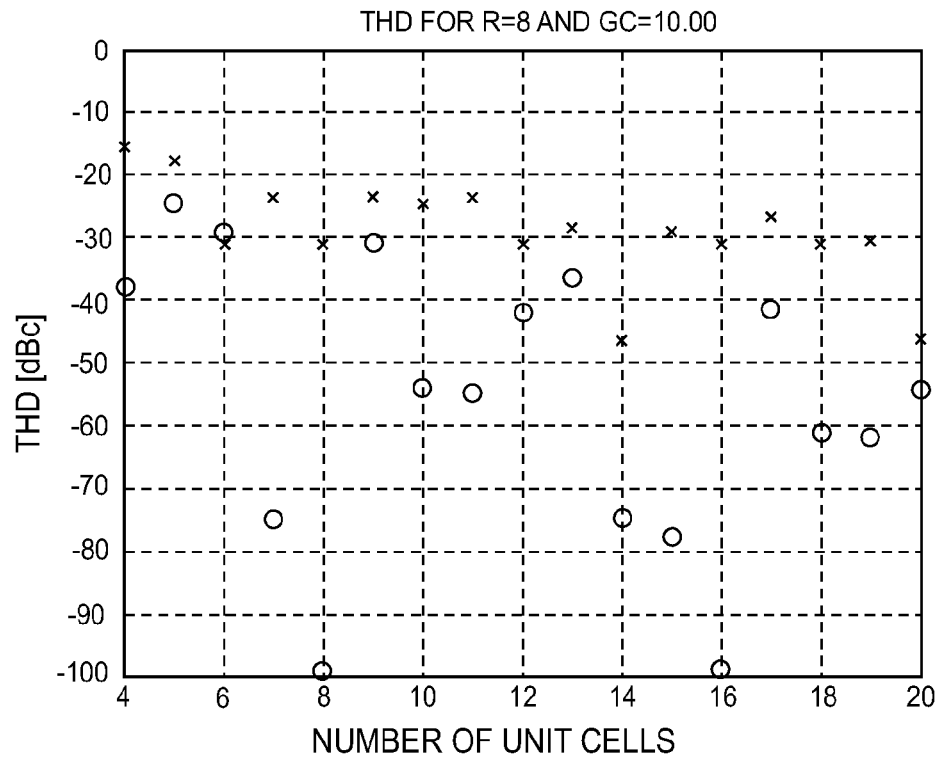
FIG. 25 is an example diagram for the quadrature mixer configuration of FIG. 9, plotting THD for R=8 and (common) $G_C=10$, with (x) representing a non-optimized and ideally terminated mixer configuration and (o) representing an optimized mixer configuration, as taught herein.

As another example, FIG. 25 illustrates THD for a quadrature mixer configuration using R=8 and $G_C$=10, with (x) representing a non-optimized and ideally terminated quadrature mixer configuration and (o) representing an optimized quadrature mixer configuration.

Figure 26:
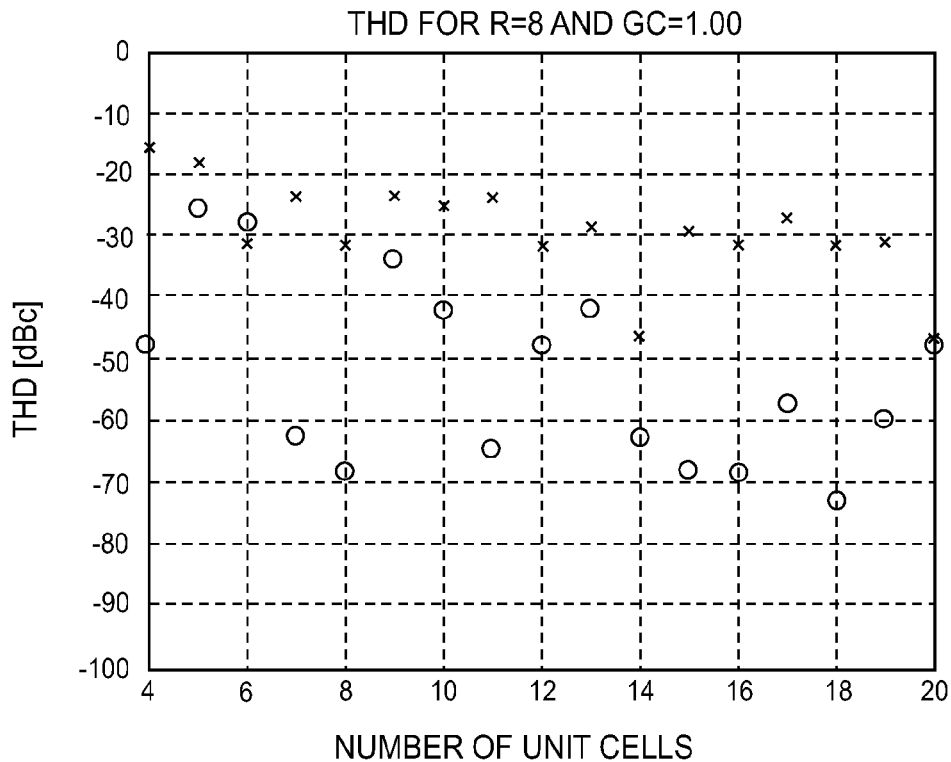
FIG. 26 is an example diagram for the quadrature mixer configuration of FIG. 9, plotting THD for R=8 and (common) $G_C=1$, with (x) representing a non-optimized and ideally terminated mixer configuration and (o) representing an optimized mixer configuration, as taught herein.

As a further example, FIG. 26 illustrates THD for a quadrature mixer configuration with R=8 and $G_C$=1, with (x) representing a non-optimized and ideally terminated mixer configuration and (o) representing an optimized mixer configuration.

Because the mixers 10 at issue here operate as time-variant linear and memory-less devices, those of ordinary skill in the art will appreciate that the above analysis and optimization can be repeated for other cases, e.g. when two mixers 10 share a common load, etc. More broadly, the mixer optimization method 1200 and its variations lead to substantially relaxed requirements for the source and termination conductances 18 and 22 of any one or more mixers 10, while simultaneously providing improved harmonic rejection for given unit cell counts. In particular, the purposeful introduction of non-linearity into the quantization of mixer transconductance by the unit cells 12 allows the contemplated mixer(s) 10 to provide a higher harmonic rejection with a given number N of unit cells 12 than would be achieved with uniform quantization.

In other words, the present invention teaches the use of source and termination conductances 18 and 22 that are far from ideal and that are chosen to produce a specific non-linear relationship between the mixer transconductance $g_m$ and the sinusoidal term $\alpha = \cos(2\pi k/R)$, where R=the number of waveform samples used to model the sinusoidal waveform desired for α, and k={0, 1, ..., R−1}. This relationship causes the mixer's N unit cells 12 to produce a non-uniform quantization of the mixer transconductance $g_m$. Referring back to Eq. (4) for the ideal termination case, $g_m$ is expressed as $$g_m = G_u \sum_{k=1}^{N} (S(k) - Sbar(k)).$$

In contrast, with the non-linear quantization behavior taught herein, one or more of the quantization step changes, i.e., k changes from 1 to 2, 2 to 3, and so on, produce a non-uniform step change in the mixer transconductance $g_m$. Thus, rather than the full set of possible of control words 14 producing a corresponding uniform sequence of transconductance levels, the change between two or more of the sequential control words 14 produces a non-uniform change in transconductance levels. The mixer optimization taught herein "tunes" the non-uniformity to move the transconductance level produced by the mixer 10 in response to given ones of the control words 14 closer to the nominal transconductance points of the target sinusoidal waveform.

Thus, the mixer 10 taught herein has N unit cells 12 and termination conductances Gs and $G_L$ set to allow for a certain level of harmonic rejection which is not achievable when that same number of unit cells 12 is used in combination with a termination conductance product $G_L G_S \gg G_m^2$. The mixer 10 uses sequences of code words 14 that are patterned to match the advantageous quantization non-uniformity, so that those quantization levels corresponding to the desired sinusoidal function are chosen during live operation of the mixer 10.

In one or more embodiments, the mixer 10 is configured to use a programmable number of samples per LO period, and for each number of samples R per period, the mixer 10 correspondingly uses at least one of: a different number of unit cells 12, different phase offsets, and different termination conductances. Thus, while the mixer 10 may be built with, e.g., N' unit cells 12 in total, it will use a number N of them in live operation for transconductance quantization, in dependence on the number of samples R being used, where N≤N'.

Broadly then, as taught herein, a mixer 10 that operates with N unit cells 12 that can represent N+1 transconductance levels, where M out of the N+1 transconductance levels are used to represent samples of a sinusoidal transconductance. These M samples include one or more transconductance levels that are shifted from the levels that would be obtained with uniform quantization, and they thus represent a non-linear fitting of the transconductance quantization levels to the nominal transconductance points of the desired sinusoidal waveform. The digital sequencer 24 stores or otherwise generates a sequence of M code words 14 corresponding to the M transconductance levels defining the sinusoid (or uses whatever combination of sign and magnitude values are needed to signal the M levels)

The conductance values for the source and load termination conductances 18 and 22 are chosen so as to ensure that M transconductance levels correspond to the nominal sinusoid samples with an accuracy at least corresponding to a certain level of harmonic rejection performance, e.g., expressed as a THD or a per-harmonic measure. It is notable here that the level of harmonic rejection harmonic rejection is substantially larger for a given unit cell count than what is possible when the $G_S$ and $G_L$ values are much larger than $G_m$.

In short, the purposeful manipulation of the values for the $G_S$ and $G_L$ produces a nonlinear relationship between $g_m$ and alpha (α), but the mixer 10 is configured to use that sequence of control words 14 {S<1:N>} that select the non-uniformly quantized levels best matching the sinusoidal transconductance samples required. For programmable embodiments that allow a varying number of samples R per LO period, the source and load termination conductances 18 and 12 are also programmable, to ensure high harmonic rejection for different numbers of samples R per LO period. For example, there are multiple, digitally selectable elements, or combinations of elements, used for the source and load termination conductances 18 and 22, and the selection of a given R maps into the selection of given elements or combinations of elements, to yield the proper matching of termination conductance values to the selected value of R.

Notably, modifications and other embodiments of the disclosed invention(s) will come to mind to one skilled in the art having the benefit of the teachings presented in the foregoing descriptions and the associated drawings. Therefore, it is to be understood that the invention(s) is/are not to be limited to the specific embodiments disclosed and that modifications and other embodiments are intended to be included within the scope of this disclosure. Although specific terms may be employed herein, they are used in a generic and descriptive sense only and not for purposes of limitation.

The invention claimed is:

1. A time-discrete harmonic rejection mixer circuit comprising:
a parallel set of N unit cells that quantize a mixer transconductance into N+1 selectable levels, each level selectable by application of a corresponding digital control word to the set of unit cells;
a mixer input port coupled to one end of the set of unit cells through a source termination conductance; and
a mixer output port coupled to the other end of the set of unit cells through a load termination conductance;
said source and load termination conductances having conductance values producing a non-uniform quantization of said mixer transconductance by the set of unit cells so that a subset of the quantization levels better match a set of nominal transconductance points corresponding to a desired sinusoidal Local Oscillator (LO) waveform than would be achieved with a uniform quantization of said mixer transconductance; and
a digital sequencer configured to store or otherwise generate a sequence of digital control words corresponding to said subset of quantization levels, and further configured to apply said sequence of digital control words to the set of unit cells at a timing corresponding to a frequency of the sinusoidal LO waveform.

2. The mixer circuit of claim 1, wherein the source and load termination conductances are equal.

3. The mixer circuit of claim 1, wherein the source and load termination conductances are unequal.

4. The mixer circuit of claim 1, wherein said mixer circuit comprises a first one of two nominally identical mixer circuits configured to operate as quadrature mixers with respect to a common source or load.

5. The mixer circuit of claim 1, wherein the source and load termination conductances have values on the order of the maximum value of mixer conductance.

6. The mixer circuit of claim 1, wherein said sequence of digital control words corresponding to said subset of the quantization levels comprises a first sequence representing a first phase offset for the desired sinusoidal LO waveform, and wherein the digital sequencer is configured to store or generate one or more additional sequences representing one or more additional phase offsets, and to select one of said sequences as indicated by a phase control signal input to said digital sequencer.

7. The mixer circuit of claim 1, wherein the digital sequencer or an associated control unit further included in the mixer circuit is configured to control said mixer circuit to operate with a programmable number of waveform samples per LO period, where when changing from one programmable number of samples to another, the mixer circuit is configured to do at least one of: (a) change the value of N and thus use a different number of unit cells to quantize the mixer transconductance; (b) change a phase offset; and (c) change the conductance value for one or both of the source and load termination conductances.

8. A time-discrete harmonic rejection mixer circuit comprising:
a parallel set of unit cells configured to quantize a mixer transconductance into a defined number of discrete levels, each level selectable by application of a corresponding digital code word to the set of unit cells;
a mixer input port coupled to one end of the set of unit cells through a source termination conductance and a mixer output port coupled to the other end of the set of unit cells through a load termination conductance;
said source and load termination conductances having conductance values chosen to introduce a purposeful non-linearity into the quantization function implemented by the unit cells, thereby resulting in series of non-uniformly spaced transconductance levels that are better fitted to a nominal series of transconductance points representing the desired sinusoidal waveform for the mixer transconductance; and
further comprising a digital sequencer configured to apply a sequence of digital code words to said set of unit cells at a timing corresponding to a desired Local Oscillator (LO) frequency, said applied sequence of digital code words corresponding to said series of non-uniformly spaced transconductance levels.

* * * * *

UNITED STATES PATENT AND TRADEMARK OFFICE
CERTIFICATE OF CORRECTION

| | | |
|---|---|---|
| PATENT NO. | : 8,624,660 B2 | Page 1 of 1 |
| APPLICATION NO. | : 13/450537 | |
| DATED | : January 7, 2014 | |
| INVENTOR(S) | : Sundström et al. | |

It is certified that error appears in the above-identified patent and that said Letters Patent is hereby corrected as shown below:

In the Specification

In Column 1, Line 53, delete "minors" and insert -- mirrors --, therefor.

In Column 4, Line 46, delete "α∈E=" and insert -- α∈ --, therefor.

In Column 9, Line 61, delete "α∈=" and insert -- α∈ --, therefor.

In Column 12, Line 15, delete "between a" and insert -- between α --, therefor.

In Column 15, Line 1, delete "conductances 18 and 12" and insert -- conductances 18 and 22 --, therefor.

Signed and Sealed this
Twenty-ninth Day of March, 2016

Michelle K. Lee
*Director of the United States Patent and Trademark Office*